(12) United States Patent
Iwata et al.

(10) Patent No.: US 8,062,494 B2
(45) Date of Patent: Nov. 22, 2011

(54) MICRO-MACHINING DUST REMOVING DEVICE, MICRO-MACHINING APPARATUS, AND MICRO-MACHINING DUST REMOVING METHOD

(75) Inventors: Futoshi Iwata, Shizuoka (JP);
Masatoshi Yasutake, Chiba (JP);
Takuya Nakaue, Chiba (JP); Syuichi Kikuchi, Chiba (JP); Osamu Takaoka, Chiba (JP)

(73) Assignees: National University Corporation Shizuoka University, Shizuoka (JP); SII Nano Technology Inc., Chiba (JP)

( * ) Notice: Subject to any disclaimer, the term of this patent is extended or adjusted under 35 U.S.C. 154(b) by 1205 days.

(21) Appl. No.: 11/810,230

(22) Filed: Jun. 4, 2007

(65) Prior Publication Data
US 2008/0132151 A1    Jun. 5, 2008

(30) Foreign Application Priority Data

Jun. 5, 2006  (JP) ................................. 2006-156385
Jun. 1, 2007  (JP) ................................. 2007-147138

(51) Int. Cl.
*B23H 7/00*    (2006.01)
(52) U.S. Cl. ........................................ 204/650; 205/686

(58) Field of Classification Search ................. 204/650; 205/686
See application file for complete search history.

(56) References Cited

U.S. PATENT DOCUMENTS
7,867,374 B2 * 1/2011 Zdeblick et al. .............. 205/649

FOREIGN PATENT DOCUMENTS
JP     2004-318091 A    11/2004
JP     2005-266650 A     9/2005

* cited by examiner

*Primary Examiner* — Alexa D. Neckel
*Assistant Examiner* — Nicholas A. Smith
(74) *Attorney, Agent, or Firm* — Brinks Hofer Gilson & Lione

(57) ABSTRACT

There is a micro-machining apparatus for removing the micro-machining dust generated at the time of machining while a workpiece M is machined within a liquid W using a probe tip. The apparatus includes a stage on which the workpiece is to be placed; a probe having the probe tip, a machining device having a moving means that moves the stage and the probe relative to each other to machine the workpiece by the probe tip, and a micro-machining dust removing device having a first electrode and a second electrode that are arranged in the liquid so as to sandwich the probe tip therebetween, and a voltage application means that applies a voltage to between both the electrodes to move the micro-machining dust in the liquid.

34 Claims, 16 Drawing Sheets

MOVEMENT BY ELECTROPHORESIS

MICRO-MACHINING DUST REMOVING DEVICE, MICRO-MACHINING APPARATUS, AND MICRO-MACHINING DUST REMOVING METHOD

CROSS-REFERENCE TO RELATED APPLICATIONS

This application claims the benefit of Japanese Patent Application No. 2006-156385 filed on Jun. 5, 2006 and claims the benefit of Japanese Patent Application No. 12007-147138 filed on Jun. 1, 2007, and the entirety of these applications are hereby incorporated by reference in their entirety.

BACKGROUND OF THE INVENTION

The present invention relates to a micro-machining dust removing device that removes the micro-machining dust generated when a workpiece, such as a photomask, is machined (for example, cut) using a probe tip, a micro-machining apparatus having the micro-machining dust removing device, and a micro-machining dust removing method.

In recent years, with advancement of nanotechnology, high technology of microscopic regions, such as nano-machines, electronic devices, and memories, attracts attention, and improvements in machining technology of the regions are requested. As one of such a micro-machining means, a method using a scanning probe microscope (SPM) attracts attention. Although the scanning probe microscope has not yet lead to the machining technology for mass production like semiconductor processes, this apparatus itself is an apparatus that is simple and comparatively low-cost, and yet has nano-scale high machining accuracy. Therefore, attention is paid to using the scanning probe microscope for a trial production technique and mask correction, etc. of fundamental devices in next-generation high-density memories, nano electronics, nano-machines, etc.

As the simplest method in the machining technology using this scanning probe microscope, a method of directly scratching (cutting) a surface, using a probe of an atomic force microscope (AFM) is known.

[Patent Document 1] JP-A-2005-266650
[Patent Document 2] JP-A-2004-318091

However, the following problems are left behind the above conventional method.

That is, since the conventional technique is mechanical cutting that directly scratches a workpiece with a probe, fine cutting dust, i.e., nano-scale micro-machining dust will be generated inevitably. Meanwhile, since this machined dust has a property of being charged at the time of cutting, it easily adheres again to a probe tip of the probe, the surroundings of cutting traces, etc.

Here, if the micro-machining dust has adhered to the cutting traces or their surroundings, the micro-machining dust become obstructive and consequently the cutting traces might be recognized visually. Thus, problems occur in that the subsequent additional machining cannot be performed, or machining with high repeatability cannot be performed.

Thus, in order to eliminate such problems to the utmost, there is a case that cleaning is performed after the machining to remove the micro-machining dust. Meanwhile, although this cleaning generally includes a physical removing method using a dry ice cleaner, or a removing method using wet cleaning, all these methods require a workpiece to be transferred to a separate apparatus after being once detached from a machining apparatus. Therefore, there is a problem in that time and efforts are taken, and throughput decreases. In addition to this problem, there is a disadvantage that the dry ice cleaner is very expensive, and the wet cleaning also requires much time.

Moreover, even if such cleaning is performed, there is also a possibility that the micro-machining dust cannot be removed, and the above disadvantage before the cleaning is performed cannot be overcome. Particularly in a case where the workpiece is a photomask formed on glass, transmittance may be lowered if micro-machining dust remains.

Meanwhile, when micro-machining dust adheres to the probe tip, the probe tip to be used as a cutting edge might be covered with the micro-machining dust. Thus, the workpiece will not be gradually shaved off. Particularly in a case where a diamond probe tip is used, the workpiece will not be promptly shaved off since a chemical change is caused if ferrous micro-machining dust adheres thereto. Further, even in a case where the micro-machining dust promotes oxidation, abrasion progresses, and thus the workpiece will also not be shaved off.

As described above, when micro-machining dust adheres to the probe tip or cutting traces, various disadvantages, such as significant decline in machining accuracy and deterioration on cutting quality, are caused. Therefore, a machining process requires micro-machining dust be removed by a new method instead of the cleaning having many disadvantages. However, a means that is effective to remove the micro-machining dust generated during machining in the machining process using the atomic force microscope has not yet been found out.

The invention has been made in consideration of such a situation, and the object of the invention is to provide a micro-machining dust removing device that can surely and efficiently remove the micro-machining dust generated during machining of a workpiece from a probe tip or machining traces without causing a decrease in throughput, a removal-processing apparatus having the micro-machining dust removing device, and a micro-machining dust removing method.

SUMMARY OF THE INVENTION

The invention provides the following means in order to solve the above problems.

A micro-machining apparatus of the invention is a micro-machining apparatus for removing the micro-machining dust generated at the time of machining while a workpiece is machined within a liquid using a probe tip. The apparatus includes: a stage on which the workpiece is to be placed; a probe having the probe tip and arranged such that the probe tip face the workpiece; a machining device having a moving means that moves the stage and the probe relative to each other to machine the workpiece by the probe tip; and a micro-machining dust removing device having a first electrode and a second electrode that are arranged in the liquid so as to sandwich the probe tip therebetween, and a voltage application means that applies a voltage to between the first electrode and the second electrode to move the micro-machining dust in the liquid.

Further, a micro-machining dust removing method of the invention is a micro-machining dust removing method of removing the micro-machining dust generated at the time of machining by electrophoresis while a workpiece is machined within a liquid using a probe tip. The method includes: an environment-in-liquid setting step of arranging a probe having the probe tip on the workpiece, arranging a first electrode and a second electrode with the probe tip sandwiched therebetween, and making, on the workpiece, an environment in liquid where at least the probe tip and the first and second electrodes are dipped in liquid; a positioning step of specifying a position where the machining is to be performed by observing the workpiece by AFM observation utilizing the probe and locating the probe tip in the specified position, after the environment-in-liquid setting step; a voltage application step of applying a predetermined voltage to between the first electrode and the second electrode, after the positioning step; and a machining step of moving the probe tip and the workpiece relative to each other to machine the workpiece using the probe tip, after the voltage application step.

In the machining device and the micro-machining dust removing device according to the invention, first, an environment-in-liquid setting step is performed after a machining device and a micro-machining dust removing device are combined together. That is, after a workpiece is placed on a stage, a probe having a probe tip so as to face the workpiece is arranged. Further, a first electrode and a second electrode are arranged so as to sandwich this probe therebetween. Next, an environment in liquid where at least the probe tip, the first electrode, and the second electrode are dipped in the liquid is made on the workpiece, for example, by discharging the liquid on the workpiece.

In addition, when this environment-in-liquid setting step is performed, as described above, the environment in liquid may be made by discharging a liquid onto a workpiece using a dropper, etc., or the environment in liquid may be made using a cell within which a liquid is stored.

After this environment-in-liquid setting step is completed, the stage and the probe are moved relative to each other by a moving means, and AFM observation of the workpiece is performed in liquid using the probe. Then, the position or range where machining is to be performed is specified by this observation. Next, a positioning step of moving the stage and the prove again relative to each other by the moving means to locate the probe tip in the earlier specified position is performed.

After this positioning step is completed, a voltage application step of applying a voltage to between the first electrode and the second electrode by a voltage application means is performed. Thereby, an electric field is formed between the first electrode and the second electrode in the liquid. Then, after the electric field is formed, a machining step is started. For example, by moving the probe tip while pressing it against the workpiece, the surface of the workpiece is cut (scratched) by a predetermined range. In this case, an unnecessary portion of the workpiece can be shaved off and thereby corrected (mask correction). As such, the workpiece is machined using the probe tip.

Since nano-scale fine cutting dust (micro-machining dust) generated at the time of this machining is under the environment in liquid, it will be separated from the probe tip and the surface of the workpiece and suspended in the liquid. Furthermore, this suspended micro-machining dust will be in an electrical-charged state.

Therefore, the micro-machining dust begins to move in the liquid according to an electrophoresis phenomenon by an electric field formed between both the electrodes simultaneously when being suspended in the liquid. That is, after the micro-machining dust gradually generated by machining is once suspended in the liquid, the dust begins to move by, mainly, electrophoresis (hereinafter written as "by electrophoresis") so that it can be attracted to the second electrode. Consequently, the micro-machining dust generated in machining can be surely and rapidly separated from the probe tip and cutting traces, and the dust can be positively collected to the second electrode. That is, the micro-machining dust can be rapidly removed from a spot where machining is being performed.

Accordingly, it is possible to prevent the micro-machining dust from adhering to the probe tip or machining traces during machining. As a result, machining can be performed without being influenced by the micro-machining dust, accurate additional machining or machining having high repeatability can be performed, and machining accuracy can be improved. Further, since adhesion of the dust to the probe tip can also be prevented, degradation of cutting quality, abrasion, etc. can be prevented, and the durability of the probe tip can be improved.

Further, since the micro-machining dust can be removed simultaneously with machining without transferring the workpiece to a separate apparatus unlike conventional cleaning, removal operation can be performed efficiently, and a decrease in throughput can be prevented.

As described above, according to the micro-machining apparatus and the micro-machining dust removing method according to the invention, it is possible to perform machining while surely and efficiently removing the micro-machining dust generated during machining of a workpiece from the exploring probe or machining traces, without causing a decrease in throughput.

Further, in the micro-machining apparatus according of the invention, the first electrode is arranged in a circular-arc shape or in an annular shape around the second electrode.

Further, in the micro-machining dust removing method of the invention, a voltage is applied using the first electrode arranged in a circular-arc shape or in an annular shape around the second electrode during the voltage application step.

In the micro-machining apparatus and the micro-machining dust removing method according to the invention, in a case where micro-machining dust is moved to the second electrode, the first electrode is arranged in a circular-arc shape or in an annular shape around the second electrode. Thus, when a voltage is applied to both the electrodes to form an electric field, lines of electric force can be concentrated on one place around the second electrode. Consequently, the micro-machining dust is simply moved towards the second electrode, but can be intensively collected in one place. Moreover, since the distance between the first electrode and the second electrode can be made the same in each position along on the first electrode, electric fields having the same intensity can be uniformly formed between the first electrode and the second electrode. Consequently, even if the micro-machining dust is suspended in any place of the liquid, it can be rapidly moved at the same uniform speed. As a result, the micro-machining dust generated at the time of machining can be moved more efficiently, and thereby can be collected to the second electrode.

Further, the micro-machining apparatus of the invention further includes a liquid cell having the liquid reserved therein, and having at least the probe tip, the first electrode, and the second electrode accommodated therein so as to be dipped in the reserved liquid.

Further, the micro-machining dust removing method of the invention, during the environment-in-liquid setting step, the workpiece is accommodated within a liquid cell having the liquid reserved therein, and at least the probe tip, the first electrode, and the second electrode are arranged so as to be dipped in the liquid.

In the micro-machining apparatus and the micro-machining dust removing method according to the invention, when the environment-in-liquid setting step is performed, the environment in liquid can be made using a liquid cell having the liquid reserved therein. That is, a workpiece is placed on the stage in the state where it is accommodated in the liquid cell. Then, at least the probe tip and both the electrodes are arranged so as to be dipped in the liquid reserved in the liquid cell. As such, since the environment in liquid can be simply and surely made only by utilizing the liquid cell, working efficiency can be improved.

Further, the micro-machining apparatus of the invention further includes a liquid discharge/supply means that discharges the reserved liquid to the outside from the inside of the liquid cell and supplies a new liquid into the liquid cell.

Further, the micro-machining dust removing method of the invention further includes a liquid discharge/supply step of discharging the liquid to the outside from the inside of the liquid cell, and supplying a new liquid into the liquid cell, after the machining step.

In the micro-machining apparatus and the micro-machining dust removing method according to the invention, by discharging the reserved liquid in the liquid cell to the outside by the liquid discharge supply means, if necessary, after the machining step is completed, the micro-machining dust collected to the second electrode can be discharged appropriately. Further, by supplying a new liquid into the liquid cell, replacement of the liquid can also be performed, and the liquid can be easily provided for the next machining.

By performing the liquid discharge/supply step in this way, even in a case where machining is performed in plural places, and a case where long time has been taken for machining, machining can be continued without being influenced by the micro-machining dust.

Further, in the micro-machining dust removing method of the invention, during the environment-in-liquid setting step, the liquid is discharged onto the workpiece such that at least the probe tip, the first electrode, and the second electrode are dipped.

In the micro-machining dust removing method according to the invention, during the environment-in-liquid setting step, the liquid is discharged towards the probe, the first electrode, and the second electrode by a pipette, etc. after the probe and both the electrodes are arranged. Thereby, the surroundings of at least the probe tip and both the electrodes will be surrounded by the liquid. As a result, only a region where machining is performed can be made into an environment in liquid. In particular, since the surroundings of at least the probe tip and both the electrodes where machining is performed can be made into an environment in liquid in a minimum range, the liquid can be efficiently used without being wasted, and thus cost reduction can be realized. Further, since only a minimum range where machining is performed is made into an environment in liquid, special preparation, such as preparing an exclusive cell, is unnecessary, and thus simplification of configuration can be realized. Accordingly, machining can be performed more simply and easily.

Further, the micro-machining apparatus of the invention further includes a liquid sucking means that has a hollow micro nozzle arranged such that its tip is dipped in the liquid, and sucks a liquid via the micro nozzle from its base end.

Further, the micro-machining dust removing method of the invention further includes a liquid sucking step of sucking a liquid via a hollow micro nozzle arranged such that its tip is dipped in the liquid, from its base end after the machining step.

In the micro-machining apparatus and the micro-machining dust removing method according to the invention, by sucking the liquid by the liquid suction means, if necessary, after the machining step is completed, the micro-machining dust collected to the second electrode can be discharged appropriately. Consequently, even in a case where machining is performed in plural places, and a case where long time has been taken for machining, the liquid sucking step is performed, so that machining can be continued without being influenced to the utmost by the micro-machining dust.

Further, in the micro-machining apparatus of the invention, the second electrode is housed at least in the tip of the micro nozzle that is dipped in the liquid.

Further, in the micro-machining dust removing method of the invention, the second electrode is housed at least in the tip of the micro nozzle that is dipped in the liquid.

In the micro-machining apparatus and the micro-machining dust removing method according to the invention, the second electrode is housed at least in the tip of the micro nozzle that is dipped in the liquid. Thus, in a case where micro-machining dust moves towards the second electrode, the micro-machining dust generated at the time of machining moves towards the tip of the micro nozzle. That is, micro-machining dust can be intensively collected at the tip of the micro nozzle that sucks the micro-machining dust together with the liquid. Accordingly, the micro-machining dust can be sucked and discharged more efficiently.

Further, the micro-machining apparatus of the invention further includes an integral cell that is arranged in a position close to the workpiece to reserve the liquid between itself and the workpiece to make an environment in liquid, and at least the probe, the first electrode, and the second electrode are attached to the integral cell so as to be dipped in the reserved liquid.

Further, in the micro-machining dust removing method of the invention, during the environment-in-liquid setting step, an integral cell to which at least the probe, the first electrode, and the second electrode are attached is arranged in a position close to the workpiece, and then the liquid is reserved between the integral cell and the workpiece such that the probe, the first electrode, and the second electrode are dipped, thereby making the environment in liquid.

In the micro-machining apparatus and the micro-machining dust removing method according to the invention, when the environment-in-liquid setting step is performed, the environment in liquid can be made using an integral cell. That is, after an integral cell to which the probe, the first electrode, and the second electrode are attached is arranged in a position close to the workpiece, the liquid is discharged to between the integral cell and the workpiece. Then, the discharged liquid will be reserved between the integral cell and the workpiece by the surface tension thereof. Thereby, the surroundings of at least the probe tip and both the electrodes will be dipped by the liquid. As a result, only a region where machining is performed can be made into an environment in liquid.

In particular, since the surroundings of at least the probe tip and both the electrodes where machining is performed can be made into an environment in liquid in a minimum range, the liquid can be efficiently used without being wasted, and thus cost reduction can be realized.

Further, since the liquid is reserved between the integral cell and the workpiece, the area that touches the atmosphere can be reduced as much as possible. Therefore, evaporation of the liquid can be prevented, and even if time has been taken for machining, the environment in liquid can be surely maintained. Consequently, the reliability of removal of the micro-machining dust at the time of machining can be enhanced.

Further, since the probe and both the electrodes are attached to the integral cell, the relative positional relationship between the probe and both the electrodes does not change during machining. Therefore, an electric field can be formed in a more stable state, and micro-machining dust can be more stably moved by electrophoresis.

Further, the micro-machining apparatus of the invention further includes a liquid discharge/supply means that has a supply passage and a discharge passage formed in the integral cell, and that discharges the reserved liquid to the outside from the integral cell via the discharge passage, and supplies a new liquid into the integral cell via the supply passage.

Further, the micro-machining dust removing method of the invention further includes a liquid discharge/supply step of discharging the liquid to the outside from the inside of the integral cell via a discharge passage formed in the integral cell, and supplying a new liquid into the integral cell via a supply passage formed in the integral cell, after the machining step.

In the micro-machining apparatus and the micro-machining dust removing method according to the invention, by discharging the liquid via the discharge passage by the liquid discharge supply means, if necessary, after the machining step is completed, the micro-machining dust collected to the second electrode can be appropriately discharged together with the liquid. Further, by supplying a new liquid into the supply passage, replacement of the liquid can also be performed, and the liquid can be easily provided for the next machining.

By performing the liquid discharge/supply step in this way, even in a case where machining is performed in plural places, and a case where long time has been taken for machining, machining can be continued without being influenced by the micro-machining dust.

Further, in the micro-machining apparatus of the invention, the second electrode is housed within the discharge passage.

Further, in the micro-machining dust removing method of the invention, the second electrode is housed within the discharge passage.

In the micro-machining apparatus and the micro-machining dust removing method according to the invention, the second electrode is housed in the discharge passage. Thus, the micro-machining dust generated at the time of machining moves towards the discharge passage. That is, micro-machining dust can be intensively collected to the discharge passage that discharges the micro-machining dust to the outside together with the liquid. Accordingly, the micro-machining dust can be discharged more efficiently.

Further, in the micro-machining apparatus of the invention, the probe tip has a base end supported in a cantilevered state by the lever portion, and the apparatus further includes a displacement measuring means that measures the deflection of the lever portion, and a control means that controls the moving means on the basis of measurement results by the displacement measuring means to adjust the distance between the probe tip and the workpiece such that the deflection of the lever portion becomes constant.

Further, in the micro-machining dust removing method of the invention, the probe tip is supported in a cantilevered state by the lever portion, and when the machining step is performed, machining is performed while controlling the distance between the probe tip and the workpiece such that the deflection of the lever portion becomes constant.

In the micro-machining apparatus and the micro-machining dust removing method according to the invention, machining can be performed in a state where the probe tip is pressed against the workpiece with the same force. That is, when the machining step is performed, the displacement measuring means measures the deflection of the lever portion, and the measurement result is sent to the control means. Then, the control means appropriately controls to moving means on the basis of the sent measurement result to adjust the distance between the probe tip and the workpiece such that the deflection of the lever portion become constant. Thereby, machining can be performed in a state where the probe tip is always pressed against the workpiece with the same force. Consequently, any unevenness at the time of machining can be eliminated, and thus accurate machining can be performed.

Further, the micro-machining apparatus of the invention further includes a vibrating means that vibrates at least any one of the lever portion and the stage at least in any one direction of XY directions parallel to the surface of the workpiece and a Z direction perpendicular thereto, and the displacement measuring means measures the vibrational state of the lever portion, and the control means controls the moving means on the basis of measurement results by the displacement measuring means to adjust the distance between the probe tip and the workpiece such that the vibrational state of the lever portion becomes constant.

Further, in the micro-machining dust removing method of the invention, when the machining step is performed, at least any one of the lever portion and the workpiece is vibrated at least in any one direction of a direction parallel to the surface of the workpiece and a direction perpendicular thereto, and the machining is performed while the controlling is performed such that a vibrational state becomes constant.

In the micro-machining apparatus and the micro-machining dust removing method according to the invention, when the machining step is performed, at least any one of the lever portion and the stage is vibrated at a predetermined frequency at least in any one direction of XY directions (transverse vibrations) parallel to the surface of the workpiece and a Z direction (longitudinal vibration) perpendicular thereto. That is, machining is performed while the surface of a workpiece is rubbed continuously, or knocked continuously, or while both of them are performed. Further, in this case, the displacement measuring means performs measurement of the vibrational state of the lever portion. Also, the control unit controls the moving means on the basis of the measurement results by the displacement measuring means such that the vibrational state (for example, amplitude) of the lever portion becomes constant. As a result, machining can be performed in a state where the probe tip is not simply pressed against the workpiece, but vibrations are applied in the above-described directions.

Consequently, the micro-machining dust generated at the time of machining can be made still finer. Therefore, the micro-machining dust becomes more lightweight, and its electrification property improves. Accordingly, after the micro-machining dust is suspended still more quickly, the dust can be moved by electrophoresis, and adhesion thereof to the probe tip or the workpiece can be prevented more surely. Further, since cutting performance can be enhanced even with the same pressing force by vibrating the probe tip, workability can be improved.

Particularly by performing the transverse vibration and the longitudinal vibration simultaneously, elliptical vibration machining can be performed, and consequently, micro-machining dust is easily wound up. Accordingly, the micro-machining dust can be moved still more easily. In addition, in the case where the lever portion is transversely vibrated in the XY directions, the lever portion can be vibrated in a state where it is synchronized in the XY directions as well as the lever portion is simply vibrated in the X-direction or in the Y-direction. This is preferable because the polishing effect can be expected.

Further, in the micro-machining apparatus of the invention, the voltage application means applies any one of a direct current voltage, an alternating current voltage, and a pulse voltage.

Further, in the micro-machining dust removing method of the invention, any one of a direct current voltage, an alternating current voltage, and a pulse voltage is applied during the voltage application step.

In the micro-machining apparatus and the micro-machining dust removing method according to the invention, during the voltage application step, the voltage application means selects any one of a direct current voltage, an alternating current voltage, and a pulse voltage and applies the selected voltage to between the first electrode and the second electrode. Consequently, the voltages can be separately used appropriately according to the kind of a workpiece or a liquid, or the situation of machining, and thus the usability improves. In particular, high voltage can be applied by using an alternating current voltage or pulse voltage without causing electrolysis of the liquid.

Further, in the micro-machining apparatus of the invention, the probe tip is formed from any one of diamond, Si and SiN.

In the micro-machining apparatus according to the invention, the probe tip is formed from any one of diamond, Si, and SiN. Particularly by forming the probe tip from diamond, machining can be surely performed with sharp cutting quality even if a workpiece is formed from any kind of material. Further, the durability of the probe tip can be improved.

Further, in the micro-machining apparatus of the invention, the probe tip is also used as the first electrode.

In the micro-machining apparatus according to the invention, since the probe tip is also used as the first electrode, the micro-machining dust generated by machining can be surely and promptly put into a strong electric field, and can be more rapidly moved by electrophoresis. Further, since it is not necessary to provide the first electrode separately from the probe tip, configuration can be simplified.

Further, in the micro-machining dust removing method of the invention, a liquid containing a surfactant is used as the liquid during the environment-in-liquid setting step.

In the micro-machining dust removing method according to the invention, since a surfactant is contained in the liquid, the surfactant is coupled with the surface of a workpiece or the surface of micro-machining dust, with hydrophilic groups located outside. Therefore, even if the micro-machining dust contacts the surface of the workpiece or the micro-machining dust contacts each other, during movement thereof by electrophoresis, the dust hardly adhere to each other by mutual repulsion between the hydrophilic groups. Accordingly, the micro-machining dust can be moved towards the second electrode, while adhesion thereof to the probe tip or workpiece can be prevented more surely.

In addition, it is preferable to use a surfactant that is easily influenced by an electric field by providing substituent groups that strengthen electrification property on the side of the hydrophilic-groups. Further, by appropriately selecting the property of a liquid, a voltage to be applied, and a surfactant to be adopted in view of the property of micro-machining dust, it is possible to selectively and more surely move the micro-machining dust to the first electrode or the second electrode.

Further, the micro-machining dust removing device of the invention is a micro-machining dust removing device used in combination with a machining device that machines a workpiece using a probe tip to remove, within a liquid, the micro-machining dust generated at the time of the machining. The device includes a first electrode and a second electrode that are arranged in the liquid so as to sandwich the probe tip therebetween, and a voltage application means that applies a voltage apply to between the first electrode and the second electrode to move the micro-machining dust in the liquid.

In the micro-machining dust removing device according to the invention, the first electrode and the second electrode are arranged in the liquid with the probe tip sandwiched therebetween. That is, the probe tip, and both the first and second electrodes are altogether placed under an environment in liquid. After both the electrodes are arranged, a voltage is applied to between the first electrode and the second electrode by the voltage application means to form an electric field between both the electrodes.

Thereafter, a workpiece is machined by the machining apparatus using the probe tip (for example, the workpiece is cut by the probe tip). Then, since nano-scale fine cutting dust (micro-machining dust) generated at the time of this machining is under the environment in liquid, it will be separated from the probe tip and the surface of the workpiece and suspended in the liquid. Furthermore, this suspended micro-machining dust will be in an electrical-charged state.

Therefore, the micro-machining dust begins to move in the liquid according to an electrophoresis phenomenon by an electric field formed between both the electrodes simultaneously when being suspended in the liquid. That is, after the micro-machining dust gradually generated by machining is once suspended in the liquid, the dust begins to move mainly by electrophoresis (hereinafter written as "by electrophoresis") so that it can be attracted to the second electrode. Consequently, the micro-machining dust generated in machining can be surely and rapidly separated from the probe tip and cutting traces, and the dust can be positively collected to the second electrode. That is, the micro-machining dust can be rapidly removed from a spot where the machining is being performed.

Accordingly, it is possible to prevent the micro-machining dust from adhering to the probe tip or machining traces during the machining. As a result, machining can be performed without being influenced by the micro-machining dust, accurate additional machining or machining having high repeatability can be performed, and machining accuracy can be improved. Further, since adhesion of the dust to the probe tip can also be prevented, degradation of cutting quality, abrasion, etc. can be prevented, and the durability of the probe tip can be improved.

Further, since the micro-machining dust can be removed simultaneously with machining without transferring the workpiece to a separate apparatus unlike conventional cleaning, removal operation can be performed efficiently, and a decrease in throughput can be prevented.

As described above, according to the micro-machining dust removing device according to the invention, it is possible to surely and efficiently remove the micro-machining dust generated during machining of a workpiece from the exploring probe or machining traces, without causing a decrease in throughput. Further, according to the micro-machining dust removing device according to the invention, even if the environment at the time of machining is not an environment in liquid, the same operational effects as those described above can be exhibited if the environment when the micro-machining dust is moved is an environment in liquid.

Further, in the micro-machining dust removing device of the invention, the first electrode is arranged in a circular-arc shape or in an annular shape around the second electrode.

In the micro-machining dust removing device according to the invention, in a case where micro-machining dust is moved to the second electrode, the first electrode is arranged in a circular-arc shape or in an annular shape around the second electrode. Thus, when a voltage is applied to both the electrodes to form an electric field, lines of electric force can be concentrated on one place around the second electrode. Consequently, the micro-machining dust is not simply moved towards the second electrode, but can be intensively collected in one place. Moreover, since the distance between the first electrode and the second electrode can be made the same in each position along on the first electrode, electric fields having the same intensity can be uniformly formed between the first electrode and the second electrode. Consequently, even if the micro-machining dust is suspended in any place of the liquid, it can be rapidly moved at the same uniform speed. As a result, the micro-machining dust generated at the time of machining can be moved more efficiently, and thereby can be collected to the second electrode.

Further, the micro-machining dust removing device of the invention further includes a liquid sucking means that has a hollow micro nozzle arranged such that its tip is dipped in the liquid, and sucks a liquid via the micro nozzle from its base end.

In the micro-machining dust removing device according to the invention, by sucking the liquid by the micro nozzle of the liquid suction means, if necessary, after the machining is completed, the micro-machining dust collected to the second electrode can be discharged appropriately. Consequently, even in a case where machining is performed in plural places, and a case where long time has been taken for machining, machining can be continued without being influenced to the utmost by the micro-machining dust.

Further, in the micro-machining dust removing device of the invention, the second electrode is housed at least in the tip of the micro nozzle that is dipped in the liquid.

In the micro-machining dust removing device according to the invention, the second electrode is housed at least in the tip of the micro nozzle that is dipped in the liquid. Thus, in a case where micro-machining dust moves towards the second electrode, the micro-machining dust generated at the time of machining moves towards the tip of the micro nozzle. That is, micro-machining dust can be intensively collected at the tip of the micro nozzle that sucks the micro-machining dust together with the liquid. Accordingly, the micro-machining dust can be more efficiently sucked and discharged together with the liquid.

Further, in the micro-machining dust removing device of the invention, the voltage application means applies any one of a direct current voltage, an alternating current voltage, and a pulse voltage.

In the micro-machining dust removing device according to the invention, when the voltage application means applies a voltage to between the first electrode and the second electrode, it selects any one of a direct current voltage, an alternating current voltage, and a pulse voltage and applies the selected voltage to between the first electrode and the second electrode. Consequently, the voltages can be separately used appropriately according to the kind of a workpiece or a liquid, or the situation of machining, and thus the usability improves. In particular, high voltage can be applied by using an alternating current voltage or pulse voltage without causing electrolysis of the liquid.

According to the micro-machining dust removing device according to the invention, it is possible to surely and efficiently remove the micro-machining dust generated during machining of a workpiece from the exploring probe or machining traces, without causing a decrease in throughput.

Further, according to the micro-machining apparatus and the micro-machining dust removing method according to the invention, it is possible to perform machining while surely and efficiently removing the micro-machining dust generated during machining of a workpiece from the exploring probe or machining traces, without causing a decrease in throughput.

BRIEF DESCRIPTION OF THE DRAWINGS

FIG. 19A is a perspective view showing a state where cutting is performed by a conventional method of performing cutting in the atmosphere, and FIG. 19B is a perspective view showing the state of cutting traces and their surroundings after cutting.

FIG. 19A is a perspective view showing a state where cutting is performed in a liquid including a surfactant, and FIG. 19B is a perspective view showing the state of cutting traces and their surroundings after cutting.

FIG. 21A is a perspective view showing a state where cutting is performed by the apparatus according to the invention while a voltage is applied to between both the electrodes in a liquid W including a surfactant, and FIG. 21B is a perspective view showing the state of cutting traces and their surroundings after cutting.

DETAILED DESCRIPTION OF THE PREFERRED EMBODIMENT

First Embodiment

Hereinafter, a first embodiment of a micro-machining dust removing device, a micro-machining apparatus, and a micro-machining dust removing method according to the invention will be described with reference to FIGS. 1 to 4.

In addition, the present embodiment will be described taking a mask M obtained by vapor-depositing chromium on a sample 2 as a workpiece. Further, a sample scanning method of moving the sample 2 in three-dimensional directions will be described as an example. Further, a case where the surface of the mask M is cut (scratched) is will be described as an example of machining using a probe tip 3a.

Figure 1:
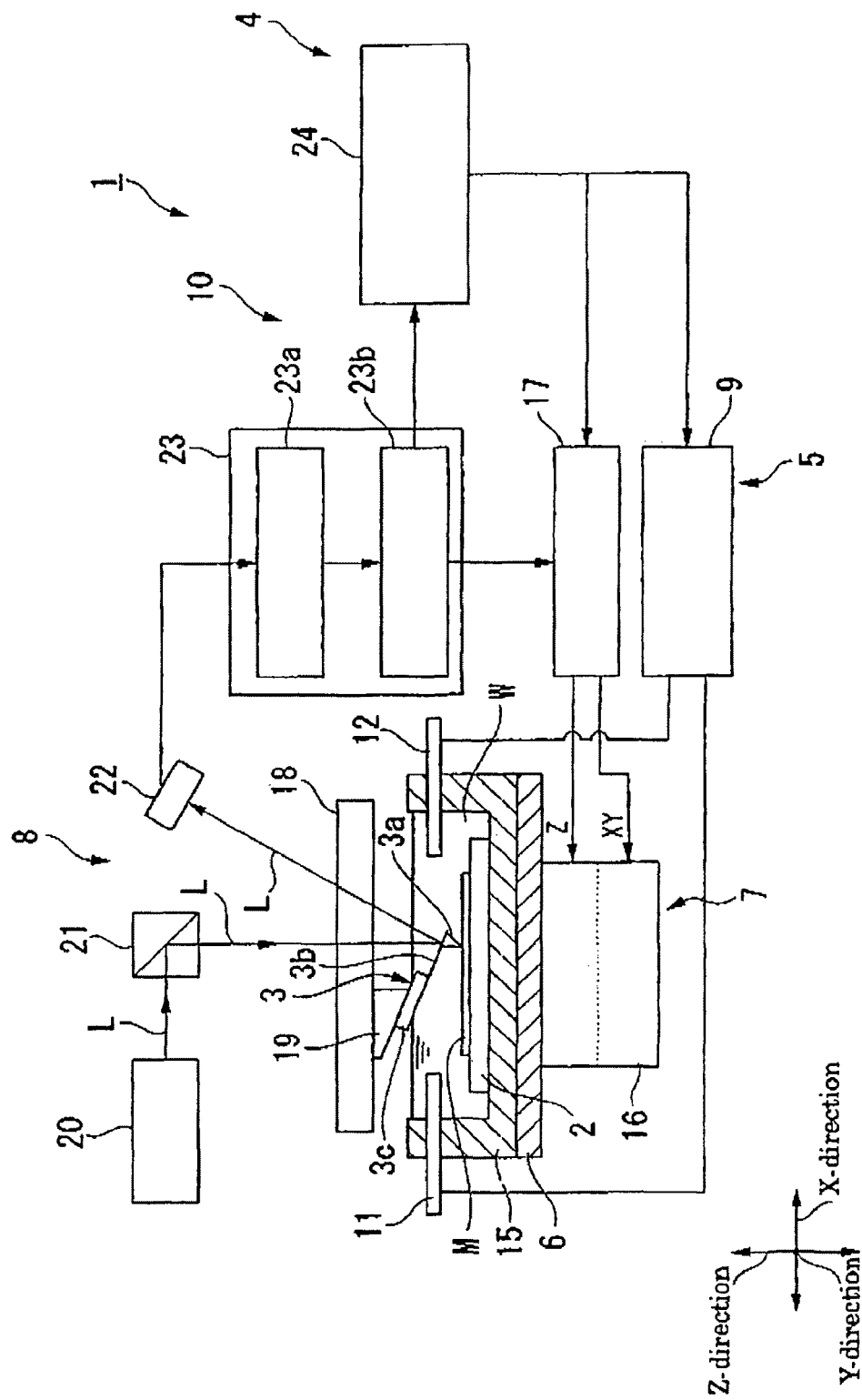
FIG. 1 is a configuration diagram showing a first embodiment of a micro-machining apparatus according to the invention.
Figure 2:
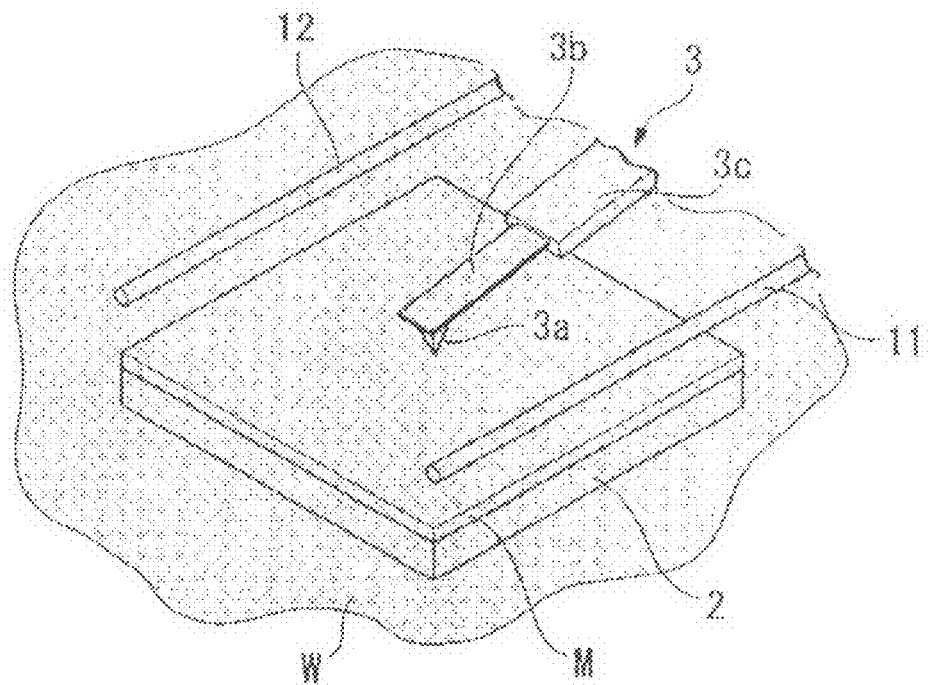
FIG. 2 is an enlarged perspective view of a probe and both electrodes, which are shown in FIG. 1.

As shown in FIGS. 1 and 2, the micro-machining apparatus 1 of the present embodiment is an apparatus that removes nano-scale micro-machining dust (micro-machining dust D) generated during machining while the mask M is cut within liquid W, such as ultrapure water, using the probe tip 3a, and the apparatus is composed of a machining device 4 and a micro-machining dust removing device 5.

The above machining device 4 includes a sample stage (stage) 6 on which the sample 2 having the mask M vapor-deposited thereon is to be placed, a probe 3 that has the probe tip 3a at the tip of a lever portion 3b, a moving means 7 that moves the sample stage 6 and the probe 3 relative to each other in the XY directions parallel to the surface of the mask M and in the Z direction perpendicular to the surface of the mask M, a displacement measuring means 8 that measures deflection of the lever portion 3b, and a control means 10 that controls the moving means 7 so that the deflection of the lever portion 3b becomes constant about the distance between the probe tip 3a and the lever portion 3b on the basis of measurement results by the displacement measuring means 8 in a state where a function generator 9 to be described below is caused to operate at the time of cutting.

Further, the above micro-machining dust removing device 5 includes a first electrode 11 and a second electrode 12 that are arranged in the liquid W so that the probe tip 3a may be sandwiched therebetween, and the function generator (voltage application means) 9 that applies a voltage to between the first electrode 11 and the second electrode 12 to move micro-machining dust D in the liquid W by electrophoresis.

Further, the micro-machining apparatus 1 of the present embodiment includes a liquid bath (liquid cell) 15 within which the liquid W is stored, and within which at least the probe tip 3a, the first electrode 11, and the second electrode 12 are accommodated so that they may be dipped in the stored liquid W. This liquid bath 15 is formed in a U-shaped cross-section the top of which is opened, and is placed on the sample stage 6 fixed to an XYZ stage 16. Also, the sample 2 is held on the bottom of this liquid bath 15 so as not to move easily.

For example, the above XYZ stage 16 is, for example, a piezoelectric element made of PZT (lead zirconate titanate), etc., and when a voltage is applied from a drive circuit 17, the XYZ stage will be minutely move in three directions including the XY directions and the Z direction according to the amount and polarity of the applied voltage. This enables the probe 3 and the sample stage 6 to be relatively moved in the XY directions and in the Z direction, as described above. That is, the XYZ stage 16 and the drive circuit 17 constitute the above moving means 7.

The above lever portion 3b has a base end supported in the shape of a cantilever by a body part 3c. That is, the probe 3 is constituted by the probe tip 3a, the lever portion 3b, and the body part 3c. Further, in the probe 3 of the present embodiment, the lever portion 3b and the body part 3c are integrally formed from silicon, silicon nitride, etc., and the probe tip 3a formed from diamond is secured to the tip of the lever portion 3b. However, the invention is not limited to this case. For example, the probe 3 may be integrally formed from an SOI substrate obtained by thermally bonding three layers including a silicon supporting layer, an oxidation layer made of $SiO_2$, and a silicon active layer together, or the probe may be formed from other materials or by other techniques.

Further, the probe 3 is detachably fixed to a slope block 19 fixed to the lower surface of a holder body 18 via the body part 3c by wires, etc. In this case, the probe 3 is fixed so that the lever portion 3b may be inclined at a predetermined angle with respect to the surface of the mask M by the slope block 19. Further, the installation position of the probe 3 is adjusted by the holder body 18 so that at least the probe tip 3a may be dipped in the liquid W. Thereby, both the mask M and the probe tip 3a remains completely dipped in the liquid W, and consequently an environment in liquid can be made around the mask M and the probe tip 3a. That is, in the present embodiment, an environment in liquid where at least the probe tip 3a, the first electrode 11, and the second electrode 12 are dipped in the liquid W is made on the mask M by utilizing the liquid bath 15.

The above holder body 18 is formed with such a size that it substantially covers an opening of the liquid bath 15. Further, the holder body 18 is formed from an optically transparent material so that the holder body allows laser light L radiated from a semiconductor laser light source 20 to be described below to be transmitted therethrough and guided to a reflecting surface (not shown) formed on the side of the rear surface of the lever portion 3b, and allows the laser light L reflected by the reflecting surface to be transmitted again therethrough and guided to a laser-light receiving unit 22 to be described below.

Above the holder body 18, the semiconductor laser light source 20 that radiates laser light L, a beam splitter 21 that reflects part of the radiated laser light L towards the reflecting surface of the lever portion 3b, and the laser-light receiving unit 22 that receives the laser light L that is reflected by the reflecting surface of the lever portion 3b and transmitted through the holder body 18 are attached to a mount (not shown). The laser-light receiving unit 22 is, for example, a quadripartite photo-detector that detects a deflection change in the lever portion 3b on the basis of the incidence position of laser light L. Also, the laser-light receiving unit 22 outputs the detected deflection change in the lever portion 3b to a preamplifier (not shown) as a DIF signal. That is, the semiconductor laser light source 20, the beam splitter 21, and the laser-light receiving unit 22 constitute the above displacement measuring means 8.

Further, after the DIF signal output to the preamplifier is amplified by this preamplifier, the amplified signal is sent to a Z-voltage feedback circuit 23 composed of an arithmetic circuit 23a and a control circuit 23b. The Z-voltage feedback circuit 23 feedback-controls the drive circuit 17 so that the DIF signal may become always constant. Thereby, when the moving means 7 operates, the distance between the probe tip 3a and the mask M can be controlled so that the deflection of the lever portion 3b becomes constant.

Further, a control unit 24, such as a personal computer, is connected to the Z-voltage feedback circuit 23. This control unit 24 is adapted to be able to acquire shape data on the surface of the mask M on the basis of a signal changed by the Z-voltage feedback circuit 23, and to perform surface shape observation.

Further, in the present embodiment, the above-described feedback control is similarly performed even at the time of cutting. That is, the control unit 24 performs height control by the same feedback control, when performing AFM observation, and when performing cutting. That is, the Z-voltage feedback circuit 23 and the control unit 24 constitute the above control means 10. In addition, this control means 10 has a function that comprehensively controls the above-described individual components. Further, the control means 10 controls to operate the function generator 9, only when performing cutting, not at the time of observation.

Both the first electrode 11 and the second electrode 12 are formed in the shape of a rod, and as shown in FIG. 2, are attached so as to sandwich the probe tip 3a therebetween in a state where they are dipped in the liquid W. Specifically, both the electrodes are attached so as to be parallel to each other with the probe tip 3a sandwiched therebetween. Both the electrodes 11 and 12 are electrically connected to the function generator 9, and a predetermined voltage is applied to the electrodes.

The function generator 9 is adapted to be able to receive an instruction from the control unit 24 to apply any one of a direct current voltage, an alternating current voltage and a pulse voltage to between both the electrodes 11 and 12.

Next, a micro-machining dust removing method of shaving the surface of the mask M vapor-deposited on the sample 2 by a predetermined range to cut an unnecessary defective portion while the micro-machining dust D is removed by electrophoresis, using the micro-machining apparatus 1 configured in this way, will be described. In addition, in the present embodiment, a case where a direct current voltage is applied to both the electrodes 11 and 12 during cutting will be described as an example.

The micro-machining dust removing method of the present embodiment is a method comprising: an environment-in-liquid setting step of arranging a probe 3 on the surface of a mask M, arranging a first electrode 11 and a second electrode 12 with a probe tip 3a sandwiched therebetween, and making, on the mask M, an environment in liquid where at least the probe tip 3a and both the electrodes 11 and 12 are dipped in liquid W; a positioning step of specifying a position where cutting is to be performed by observing the surface of the mask M by AFM observation utilizing the probe 3, and locating the probe tip 3a in the specified position, after the environment-in-liquid setting step; a voltage application step of applying a predetermined voltage to between the first electrode 11 and the second electrode 12 to form an electric field between both the electrodes 11 and 12, after the positioning step; and a machining step of cutting the surface of the mask M by a predetermined range while the distance between the probe tip 3a and the mask M is controlled so that the deflection of a lever portion 3b may become constant, after the voltage application step. These individual steps will be described below in detail.

First, after the machining device 4 and the micro-machining dust removing device 5 are combined together, the above environment-in-liquid setting step is performed using the liquid bath 15. That is, after the sample 2 on which the mask M has been vapor-deposited is accommodated in the liquid bath 15 within which the liquid W is reserved, this liquid bath 15 is placed on the sample stage 6. Then, the holder body 18 is adjusted and the probe 3 installed so that the probe tip 3a may be dipped in the liquid W reserved in the liquid bath 15, and both the electrodes 11 and 12 are installed so as to sandwich the probe tip 3a therebetween. Thereby, as shown in FIG. 1, all the mask M, the probe tip 3a, and both the electrodes 11 and 12 will be completely dipped in the liquid W, and will be placed under an environment in liquid.

After setting of this environment-in-liquid is completed, the positions of the semiconductor laser light source 20, the beam splitter 21, and the laser-light receiving unit 22 is adjusted, respectively. That is, after the laser light L radiated from the semiconductor laser light source 20 is changed in angle by the beam splitter 21, positioning is performed so that the laser light may transmit through the holder body 18 and enter the reflecting surface of the lever portion 3b, and the laser light L reflected by the reflecting surface may transmit again through the holder body 18 and enter the laser-light receiving unit 22 surely.

After this positioning, the laser light L from the semiconductor laser light source 20 is radiated, and the laser light L reflected by the reflecting surface of the lever portion 3b is detected by the laser-light receiving unit 22. Thereafter, the XYZ stage 16 is minutely moved in the Z direction so that the probe tip 3a and the mask M may approach each other by the moving means 7. When the mask M and the probe tip 3a gradually approach each other by this movement, the probe tip 3a will begin to gradually deflect under an atomic force. Then, the angle of the laser light L reflected by the reflecting surface changes, whereby the incidence position of the laser light L that enters the laser-light receiving unit 22 changes. Then, if when the deflection of the lever portion 3b reaches a determined value, the moving means 7 stopped. Thereby, the probe tip 3a can be surely located in the vicinity of the surface of the mask M.

Next, by issuing an instruction from the control unit 24 to the drive circuit 17 while this state is maintained, the XYZ stage 16 is minutely moved in the XY directions, and the surface of the mask M is AFM-observed in liquid using the probe 3.

That is, since the lever portion 3b tends to deflect according to irregularities of the surface of the mask M, the position of the laser light L (laser light L reflected by the reflecting surface) that enters the laser-light receiving unit 22 changes. The laser-light receiving unit 22 outputs a DIF signal according to this change to the preamplifier. After the output DIF signal is amplified by the preamplifier, the signal is sent to the Z-voltage feedback circuit 23. The Z-voltage feedback circuit 23 feedback-controls the drive circuit 17 so that the DIF signal may become always constant (that is, the deflection of the lever portion 3b may become always constant), and the XYZ stage 16 may be minutely moved in the Z direction. Thereby, scanning can be performed in a state where the distance between the surface of the mask M and the probe tip 3a is controlled so that the deflection of the lever portion 3b may become constant. Then, the control unit 24 can acquire shape data, etc. on the surface of the mask M on the basis of a signal changed by the Z-voltage feedback circuit 23, thereby observing surface shape.

Next, the control unit 24 specifies the position and range of a defective portion of the mask M required to be cut from the result of the AFM observation. Then, the control unit 24 causes the moving means 7 to appropriately move the XYZ stage 16 in the three-dimensional directions to cause the probe tip 3a to be contacted with and positioned in the earlier specified position, thereby performing a positioning step.

After this positioning step is completed, the control unit 24 operates the function generator 9 as a preparation step for performing a machining step. When the function generator 9 receives an instruction from the control unit 24, it performs a voltage application step of applying a direct current voltage to both the electrodes 11 and 12. Thereby, an electric field is formed between the first electrode 11 and the second electrode 12. After this electric field is formed, a machining step is started.

First, the control unit 24 causes the moving means 7 to minutely move the XYZ stage 16 in the Z direction to press the probe tip 3a against the surface of the mask M. In this case, the mask M and the probe tip 3a are made to approach each other while the deflection of the lever portion 3b is measured similarly to the operation before performing AFM observation. Then, the control unit 24 causes the operation of the XYZ stage 16 to stop temporarily on the basis of the measurement results by the displacement measuring means 8, when the deflection amount of the lever portion 3b has reached a predetermined deflection amount. Thereby, the probe tip 3a can be pressed against the surface of the mask M with a predetermined force.

Next, the control unit 24 issues an instruction to the drive circuit 17, thereby causing the XYZ stage 16 to be minutely moved in the XY directions. That is, the control unit causes the probe tip 3a pressed against the surface of the mask M with a predetermined force to be moved. Thereby, the probe tip 3a can be used to shave off the surface of the mask M. Also, a defective portion of the mask M can be cut (scratched) by appropriately moving the probe tip 3a in the XY directions. That is, mask correction can be performed.

In addition, when this machining step is performed, similarly to the AFM observation, the control unit 24 controls the moving means 7 on the basis of the measurement results by the displacement measuring means 8 so that the deflection of the lever portion 3b becomes constant. That is, the control unit performs scanning while appropriately controlling the height of the XYZ stage 16 in the Z direction so that the deflection of the lever portion 3b may become constant. Thereby, since cutting can be performed using the probe tip 3a pressed on the surface of the mask M with an always constant force, unevenness of the amount of cut can be eliminated, thereby performing accurate cutting.

Figure 3:
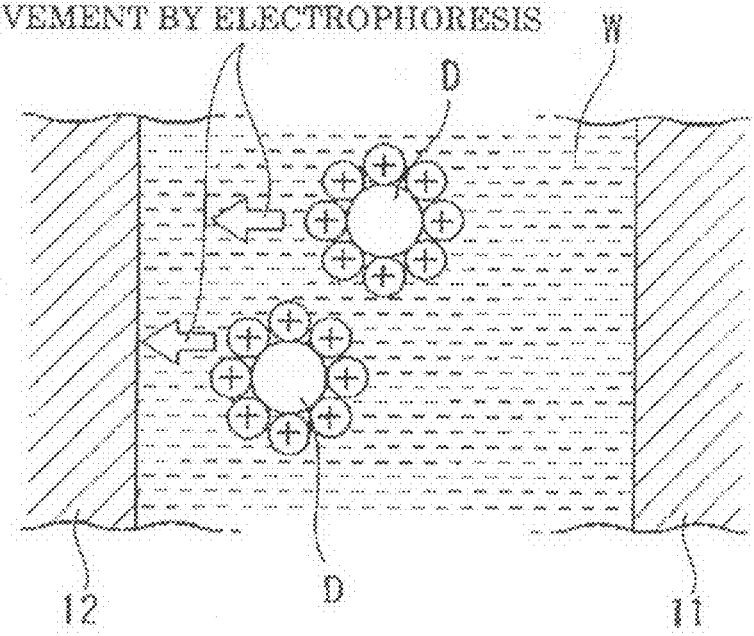
FIG. 3 is an enlarged view showing the state of micro-machining dust when the surface of a mask is cut by the micro-machining apparatus shown in FIG. 1.
Figure 4:
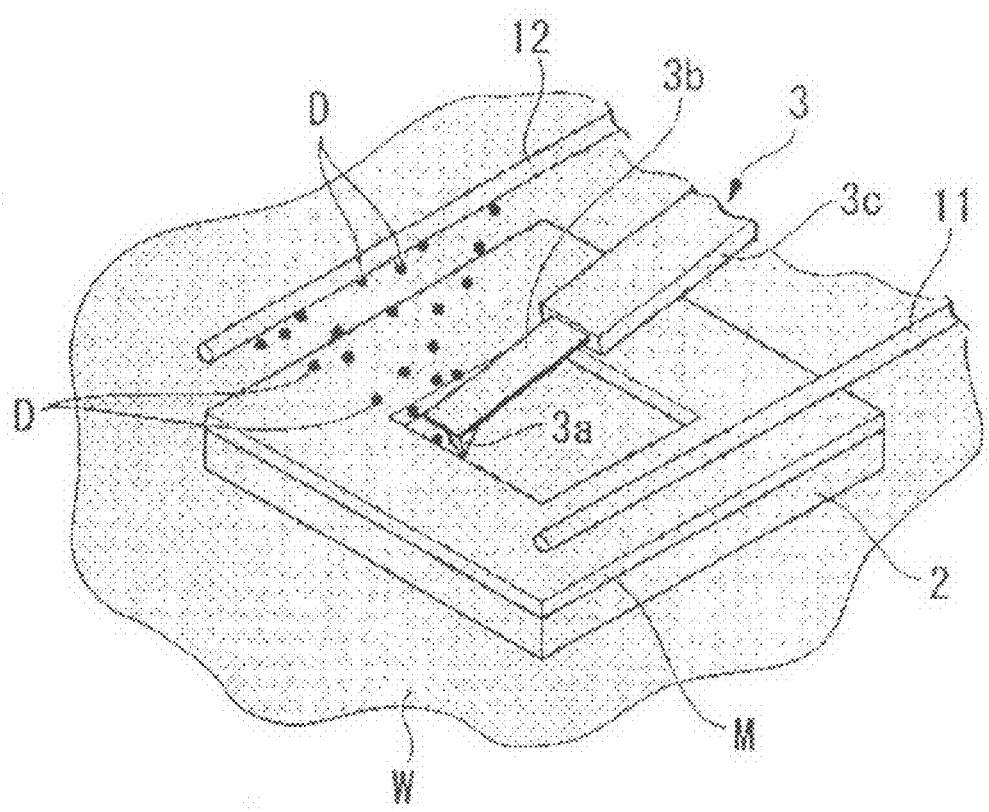
FIG. 4 is a view showing movement of the micro-machining dust when the surface of the mask is cut from the state shown in FIG. 2.

In particular, since cutting is performed in an environment in liquid, the micro-machining dust D generated at the time of the cutting will be separated from the probe tip 3a and the surface of the mask M, and suspended in the liquid. Further, this suspended micro-machining dust D, as shown in FIG. 3, will be in an electrical-charged state. Therefore, the micro-machining dust D, as shown in FIGS. 3 and 4, begins to move in the liquid according to an electrophoresis phenomenon by an electric field formed between both the electrodes 11 and 12 simultaneously when being suspended in the liquid. That is, after the micro-machining dust D gradually generated by cutting is once suspended in the liquid, the dust begins to move by electrophoresis so that it can be attracted to the second electrode 12. Consequently, the micro-machining dust D generated in cutting can be surely and rapidly separated from the probe tip 3a and cutting traces, and the dust can be positively collected to the second electrode 12. That is, the micro-machining dust D can be rapidly removed from a spot where cutting is being performed.

Accordingly, unlike a conventional apparatus, it is possible to prevent the micro-machining dust D from adhering to the probe tip 3a or cutting traces of the mask M during cutting. As a result, cutting can be continued without being influenced by the micro-machining dust D, accurate additional machining or cutting having high repeatability can be performed, and machining accuracy can be improved. Further, since adhesion of the dust to the probe tip 3a can also be prevented, degradation of cutting quality, abrasion, etc. can be prevented, and durability can be improved. Further, since the micro-machining dust D can be removed simultaneously with machining without transferring the sample 2 on which the mask M has been vapor-deposited to a separate apparatus unlike conventional cleaning, removal operation can be performed efficiently, and a decrease in throughput can be prevented.

Furthermore, since the micro-machining dust D is moved within an environment in liquid by electrophoresis, occurrence of fluctuation or convection, etc. in the liquid W during cutting can be prevented as much as possible. Therefore, the lever portion 3b can be deflected only with a pressing force between the probe tip 3a and the mask M. That is, it is possible to prevent the lever portion 3b from being deflected during cutting by factors other than the pressing force. Consequently, cutting can be surely performed with a constant pressing force. Even from this point, machining accuracy can be improved.

Further, since the environment in liquid can be simply and surely made only by dipping the sample 2 on which the mask M has been vapor-deposited in the liquid bath 15, the environment-in-liquid setting step does not require time and effort. Consequently, the time required for the environment-in-liquid setting step can be shortened, and working efficiency can be improved. Further, since the probe tip 3a is formed from diamond, cutting can be surely performed with sharp cutting quality, and the reliability of the cutting improves. Furthermore, the durability of the probe tip 3a can be improved. In addition, the probe tip 3a may be formed from Si or SiN, not limited to the diamond.

Figure 5:
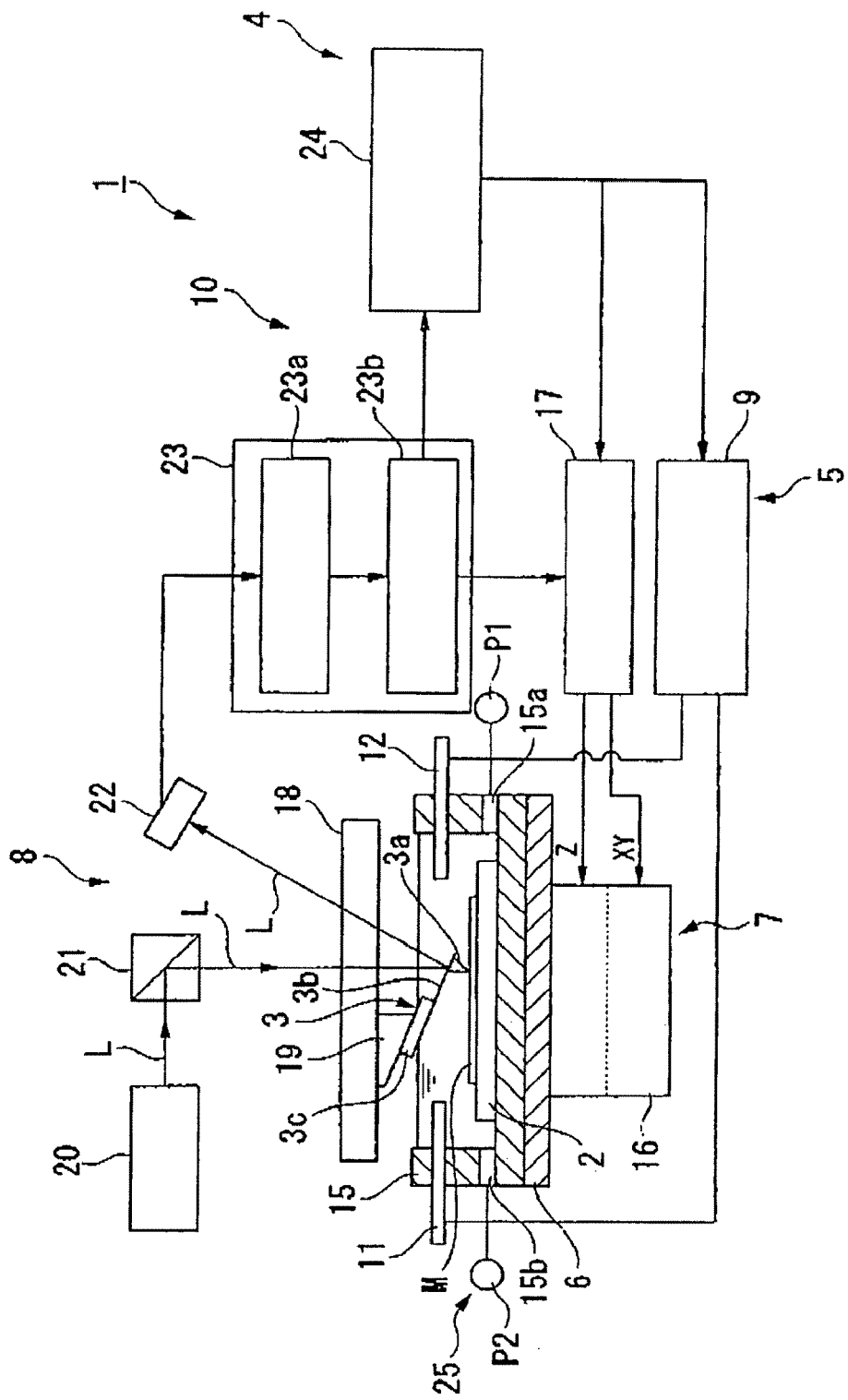
FIG. 5 is a view showing a modification of the micro-machining apparatus shown in FIG. 1, and is a view showing the micro-machining apparatus in which a supply passage and a discharge passage are formed in a liquid bath.

In addition, in the above embodiment, as shown in FIG. 5, a discharge passage 15a that discharges the liquid W reserved in the liquid bath 15 to the outside, and a supply passage 15b that supplies new liquid W to the inside from the outside may be formed. In this case, for example, a suction pump P1 or the like is connected to the discharge passage 15a, and for example, a syringe pump P2 or the like is connected to the supply passage 15b. The discharge passages 15a, the supply passage 15b, the suction pump P1, and the syringe pump P2 constitute a liquid discharge/supply means 25 that discharges the reserved liquid W to the outside from the liquid bath 15 and supplies new liquid W to the liquid bath 15.

By adopting such a configuration, after the machining step, a liquid discharge/supply step of discharging reserved liquid W and supplying new liquid W, if necessary, can be performed. That is, by discharging the liquid W reserved in the liquid bath 15 via the discharge passage 15a, if necessary, after cutting is completed, the micro-machining dust D collected to the second electrode 12 can be discharged together with the liquid W. Further, by supplying new liquid W into the liquid bath 15 via the supply passage 15b, replacement of the liquid W can also be performed, and the liquid can be easily provided for the next cutting.

By performing the liquid discharge/supply step in this way, collected micro-machining dust D can be eliminated appropriately. Thus, even in a case where cutting is performed in plural places, and a case where long time has been taken for cutting, cutting can be continued without being influenced by the micro-machining dust D.

Further, in the above embodiment, rod-shaped electrodes are used as the first electrode 11 and the second electrode 12, and both the electrodes 11 and 12 are arranged so as to be parallel to each other. However, the shape and direction of both the electrodes 11 and 12, or the positional relationship between the probe tip 3a, and both the electrodes 11 and 12 is not limited to this case. As long as the electrodes are arranged so as to sandwich at least the probe tip 3a therebetween in the liquid W, they may be designed in an arbitrary way.

Figure 6:
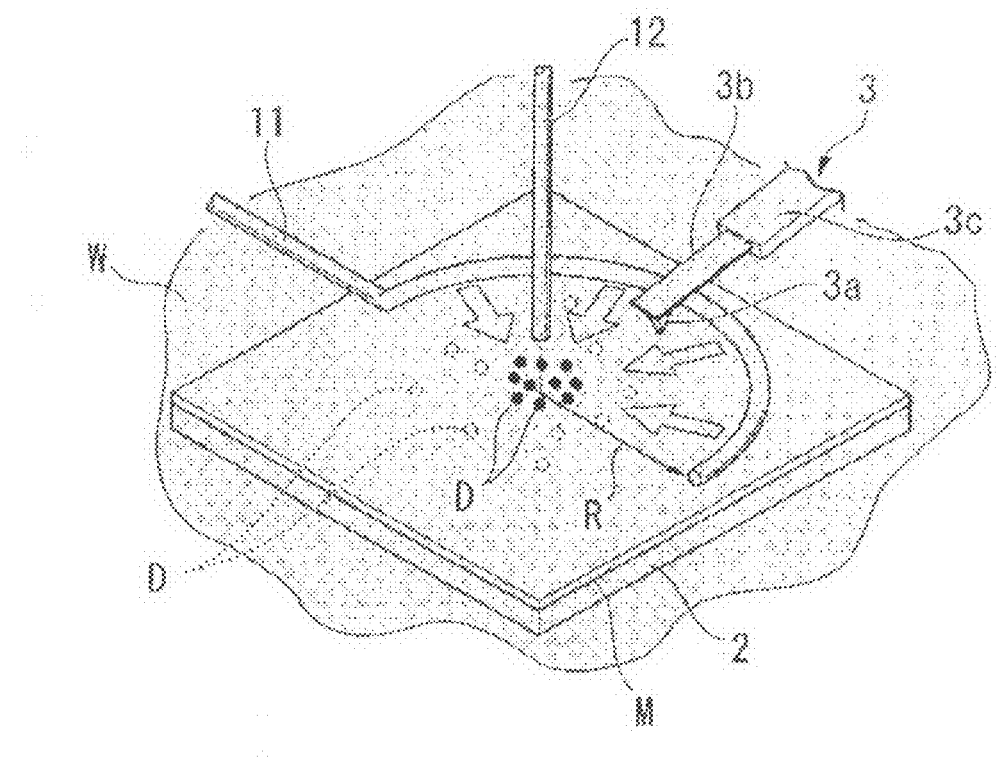
FIG. 6 is a view showing the modification of the micro-machining apparatus shown in FIG. 1, and is a perspective view showing a state where the first electrode is formed in a circular-arc shape and arranged substantially around the second electrode.
Figure 7:
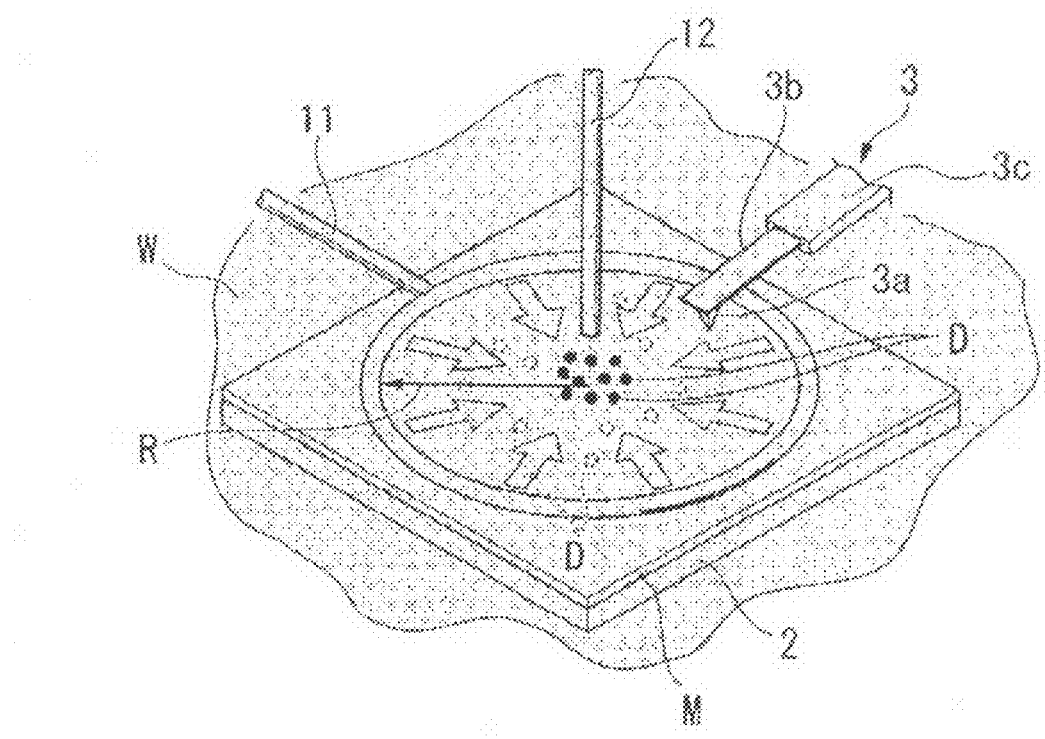
FIG. 7 is a view showing the modification of the micro-machining apparatus shown in FIG. 1, and is a perspective view showing a state where the first electrode is formed in an annular shape and arranged substantially around the second electrode.

For example, as shown in FIG. 6, the first electrode 11 may be formed in the shape of a circular arc, and the first electrode 11 may be arranged around the second electrode 12. Furthermore, as shown in FIG. 7, the first electrode 11 may be formed in an annular shape (ring shape), and the first electrode 11 may be arranged around the second electrode 12.

By adopting such configurations, when a voltage is applied to both the electrodes 11 and 12 according to the voltage application step to form an electric field, lines of electric force can be concentrated on one place around the second electrode 12. Consequently, the micro-machining dust D is simply moved towards the second electrode 12, but can be intensively collected in one place. Moreover, since the distance between the first electrode 11 and the second electrode 12 can be made the same in each position along on the first electrode 11, that is, a radius R can be maintained, electric fields having the same intensity can be uniformly formed between the first electrode 11 and the second electrode 12.

Consequently, even if the micro-machining dust D is suspended in any place of the liquid W, it can be rapidly moved at the same uniform speed. As a result, the micro-machining dust D generated at the time of cutting can be moved more efficiently, and thereby can be collected to the second electrode 12.

Second Embodiment

Next, a second embodiment of a micro-machining dust removing device, a micro-machining apparatus, and a micro-machining dust removing method according to the invention will be described with reference to FIG. 8. In addition, in the second embodiment, the same components as those in the first embodiment are denoted by the same reference numerals, and the description thereof is omitted herein.

The second embodiment and the first embodiment are different from each other in that, in the first embodiment, an environment in liquid is made by dipping the sample 2 on which the mask M has been vapor-deposited in the liquid W reserved in the liquid bath 15, but in the second embodiment, only a minimum range where cutting is performed is made into an environment in liquid.

Figure 8:
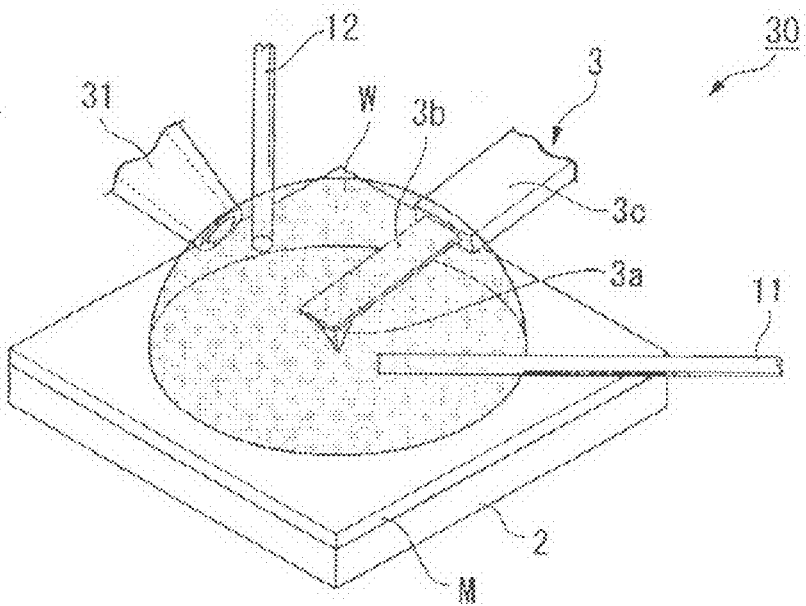
FIG. 8 is a view showing a second embodiment of the micro-machining apparatus according to the invention, and is a perspective view around a probe and both electrodes.

That is, the micro-machining apparatus 30 of the present embodiment, as shown in FIG. 8, makes an environment in liquid using a liquid discharge device 31, such as a pipette, to a base end of which a syringe pump (not shown) is connected, without using the liquid bath 15. In addition, the first electrode 11 and the second electrode 12 in the present embodiment are formed in the shape of a rod similarly to the first embodiment.

In the case of the micro-machining apparatus 30 of the present embodiment, during the environment-in-liquid setting step, a proper quantity of liquid W is discharged towards the probe 3 and both the electrodes 11 and 12 by the liquid discharge device 31 after the probe 3 and both the electrodes 11 and 12 are arranged on the mask M. Then, the discharged liquid W, as shown in FIG. 8, will be held on the surface of the mask M by the surface tension thereof, with at least the probe tip 3a and both the electrodes 11 and 12 being included in the liquid. In addition, a case where the liquid is turned into a droplet is shown in FIG. 8. Thereby, the surroundings of at least the probe tip 3a and both the electrodes 11 and 12 will be surrounded by the liquid W. As a result, only a region where cutting is performed can be made into an environment in liquid.

In particular, since only the surroundings of the probe tip 3a and both the electrodes 11 and 12 that perform cutting are made into an environment in liquid in a minimum range, the liquid W can be efficiently used without being wasted, and thus cost reduction can be realized. Further, since only a minimum range where cutting is performed is made into an environment in liquid, special preparation, such as preparing an exclusive cell, is unnecessary, and thus simplification of configuration can be realized. Accordingly, cutting can be performed more simply and easily.

Third Embodiment

Next, a third embodiment of a micro-machining dust removing device, a micro-machining apparatus, and a micro-machining dust removing method according to the invention will be described with reference to FIGS. 9 to 11. In addition, in the third embodiment, the same components as those in the second embodiment are denoted by the same reference numerals, and the description thereof is omitted herein.

The third embodiment and the second embodiment are different from each other in that, in the second embodiment, both the first electrode 11 and the second electrode 12 are formed in the shape of a rod, whereas, in the third embodiment, the first electrode 11 is formed in an annular shape, and the first electrode 11 is arranged substantially around the second electrode 12.

Furthermore, the third embodiment is also different from the second embodiment in that, in the second embodiment, liquid W is simply discharged by the liquid discharge device 31, but in the third embodiment, droplet-like liquid W can be sucked appropriately.

Figure 9:
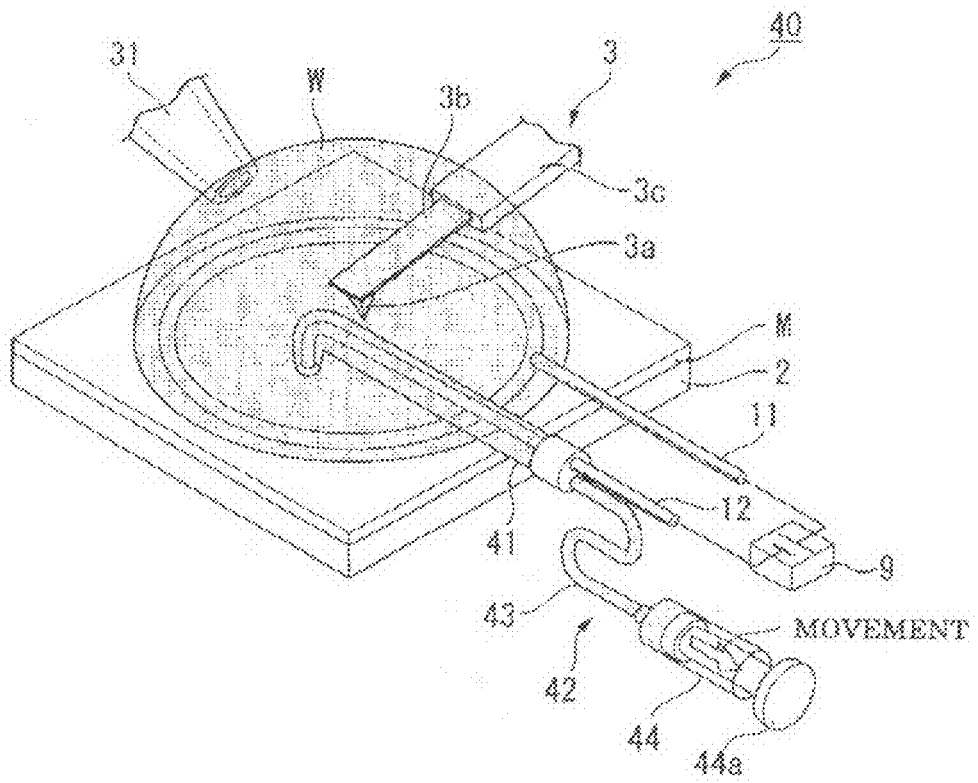
FIG. 9 is a view showing a third embodiment of the micro-machining apparatus according to the invention, and is a perspective view around a probe and both electrodes.

That is, as shown in FIG. 9, the micro-machining device 40 of the present embodiment has a micro hollow nozzle 41 arranged so that the tip of the nozzle may be dipped in the liquid W, and includes a liquid suction device 42 (liquid suction means) that sucks the liquid W from a base end via the micro nozzle 41.

Figure 10:
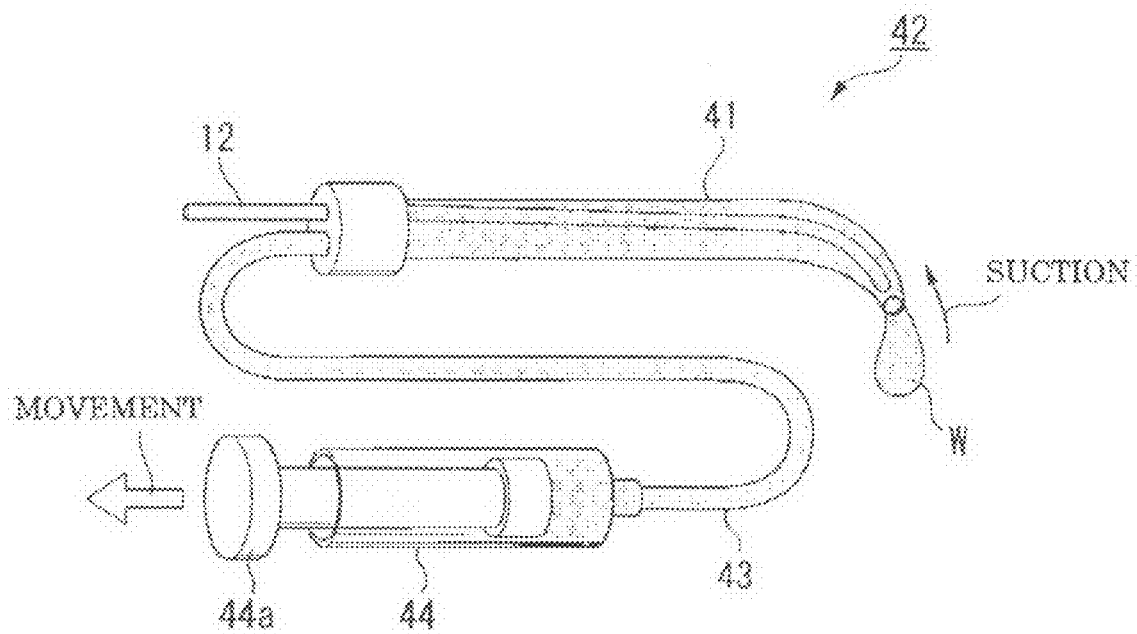
FIG. 10 is a configuration diagram of a liquid suction device that constitutes the micro-machining apparatus shown in FIG. 9.

The micro nozzle 41, as shown FIG. 10, is fabricated from, for example, a minute hollow glass tube, and has a syringe 44 attached to its base end via a tube 43. Consequently, the liquid W can be sucked into the micro nozzle 41 by moving a piston part 44a of the syringe 44 towards the base end.

That is, the micro nozzle 41, the tube 43, and the syringe 44 constitute the above liquid suction device 42. In addition, it is preferable that the tube 43 and the micro nozzle 41 are filled with the liquid W in advance because the suction becomes easy.

Furthermore, the second electrode 12 of the present embodiment is made of a thin metal wire, etc., and is housed within the micro nozzle 41 from the base end of the micro nozzle 41 to the tip thereof. In this case, the tip of the second electrode 12 is located in the vicinity of the tip of the micro nozzle 41, and the base end thereof is connected to the function generator 9.

When cutting of the mask M is performed by the micro-machining device 40 configured in this way, lines of electric force can be concentrated on one place around the second electrode 12 because the first electrode 11 is annularly formed around the second electrode 12. Consequently, the micro-machining dust D is simply moved towards the second electrode 12, but can be intensively collected in one place.

Figure 11:
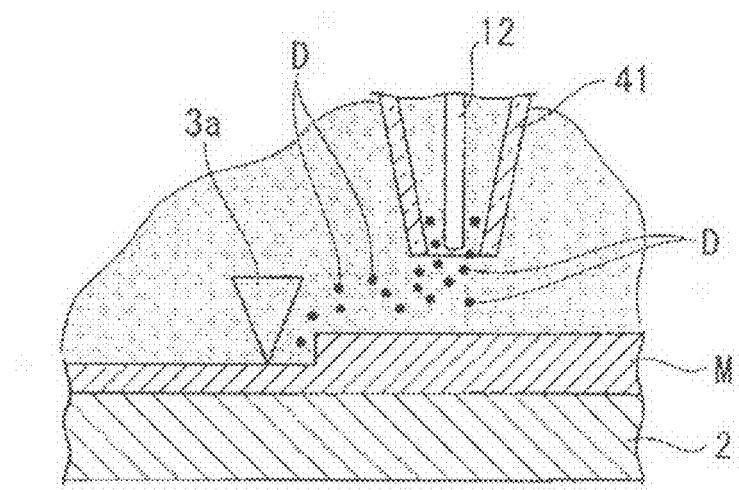
FIG. 11 is an enlarged view showing the state of micro-machining dust when the surface of a mask is cut by the micro-machining apparatus shown in FIG. 9.

Moreover, since the second electrode 12 is housed within the micro nozzle 41, and the tip of the second electrode is located in the vicinity of the tip of the micro nozzle 41, as shown in FIG. 11, the micro-machining dust D generated at the time of cutting moves towards the tip of the micro nozzle 41. Consequently, the micro-machining dust D can be intensively collected within the micro nozzle 41, or in the vicinity of an opening at the tip of the micro nozzle 41.

Further, since the first electrode 11 is annually formed substantially around the second electrode 12, the distance between the first electrode 11 and the second electrode 12 can be made the same in each position along on the first electrode 11, and electric fields having the same intensity can be uniformly formed between the first electrode 11 and the second electrode 12. Accordingly, even if the micro-machining dust D is suspended in any place of the liquid, the dust can be rapidly moved towards the tip of the micro nozzle 41 at the same uniform speed. Even from this point, the micro-machining dust D can be efficiently and intensively collected at the tip of the micro nozzle 41.

Next, after the cutting is completed, a liquid sucking step of recovering droplet-like liquid W from on the mask M is performed. That is, the piston part 44a of the syringe 44 is moved towards the base end of the micro nozzle 41 if necessary. Thereby, the liquid W can be sucked into the micro nozzle 41, and the micro-machining dust D intensively collected at the tip of the micro nozzle 41 can be discharged together with the liquid W. In addition, by supplying new liquid W using the liquid discharge device 31, replacement of the liquid W can also be performed, and the liquid can be easily provided for the next cutting.

Since collected micro-machining dust D can be appropriately discharged in this way, even in a case where cutting is performed in plural places, and a case where long time has been taken for cutting, cutting can be continued without being influenced by the micro-machining dust D.

Fourth Embodiment

Next, a fourth embodiment of a micro-machining dust removing device, a micro-machining apparatus, and a micro-machining dust removing method according to the invention will be described with reference to FIG. 12. In addition, in the fourth embodiment, the same components as those in the third embodiment are denoted by the same reference numerals, and the description thereof is omitted herein.

The fourth embodiment and the third embodiment are different from each other in that, in the third embodiment, the probe 3, the first electrode 11, and the second electrode 12 are arranged separately, whereas, in the fourth embodiment, the probe 3, the first electrode 11, and the second electrode 12 are attached to an integral cell 51 and thereby configured integrally.

Figure 12:
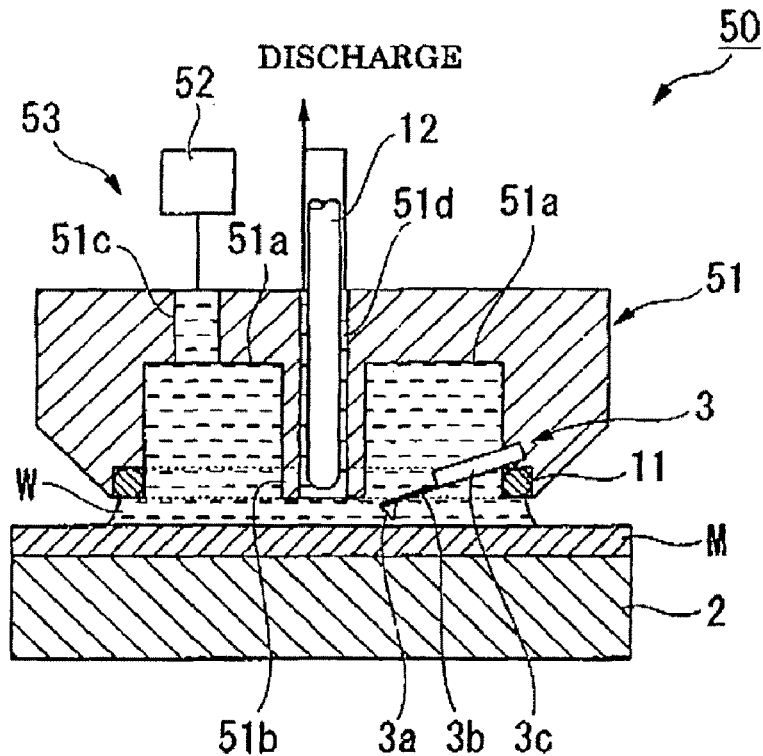
FIG. 12 is a view showing a fourth embodiment of the micro-machining apparatus according to the invention, and is a sectional view of an integral cell.

That is, the micro-machining apparatus 50 of the present embodiment, as shown in FIG. 12, is arranged in a position close to the surface of the mask M, and includes an integral cell 51 that reserves the liquid W between itself and the mask M to make an environment in liquid.

This integral cell 51 is formed in the shape of a cylindrical, and has an annular groove 51a formed in a facing surface thereof that faces the surface of the mask M. Therefore, a projection 51b the periphery of which is surrounded by the groove 51a is formed substantially in a central portion of the facing surface of the integral cell, and the tip of the projection 51b is made flush with the facing surface. Further, the integral cell 51 is formed with a supply passage 51c that supplies the liquid W into the groove 51a from the outside. Further, a supply unit 52, such as a syringe pump, which delivers the liquid W, is attached to the supply passage 51c. Thereby, the liquid W is supplied into the groove 51a via the supply passage 51c. In addition, the supplied liquid W will be held and reserved between the mask M and the integral cell 51 by the surface tension thereof.

Further, the projection 51b is formed with a discharge passage 51d for discharging the supplied liquid W to the outside. That is, the supply passage 51c, the discharge passage 51d, and the supply unit 52 constitute a liquid discharge/supply means 53 that discharges stored liquid W to the outside of the integral cell 51 and supplies new liquid W to the integral cell 51.

Further, the second electrode 12 made of a thin metal wire is housed within the above discharge passage 51d. Further, the first electrode 11 that is formed annularly is attached to an inner peripheral surface of the groove 51a such that it is arranged substantially around the second electrode 12 housed within the discharge passage 51d. Further, similarly to the above, the probe 3 of the present embodiment is also attached to the inner peripheral surface of the groove 51a. Consequently, the probe 3, the first electrode 11, and the second electrode 12 are attached to the integral cell 51 so that they may be dipped in the reserved liquid W.

In the micro-machining apparatus 50 configured in this way, when the environment-in-liquid setting step is performed, the liquid W is supplied into the groove 51a from the supply unit 52 via the supply passage 51c after the integral cell 51 to which the probe 3, the first electrode 11, and the second electrode 12 are brought into close contact with the mask M. Then, the supplied liquid W will be held and reserved between the surface of the mask M, and the integral cell 51 by the surface tension thereof while filling the inside of the groove 51a. Thereby, the surroundings of at least the probe tip 3a and both the electrodes 11 and 12 will be dipped in the liquid W. As a result, only a region where machining is to be performed can be made into an environment in liquid. In particular, since a minimum range where machining is performed is made into an environment in liquid, the liquid W can be efficiently used without being wasted, and thus cost reduction can be realized.

After the above-described environment-in-liquid setting step is completed, a voltage application step and a machining step are performed. Even in the present embodiment, similarly to the third embodiment, the first electrode 11 is annually formed substantially around the second electrode 12. Thus, the micro-machining dust D generated at the time of cutting can be intensively collected in the second electrode 12 housed within the discharge passage 51d. That is, the micro-machining dust D can be intensively collected in the vicinity of an opening of the discharge passage 51d.

Next, by discharging the reserved liquid W via the discharge passage 51d, if necessary, after the machining step is completed, the micro-machining dust D collected to the second electrode 12 can be discharged together with the liquid W. In this case, since the micro-machining dust D are intensively collected in the vicinity of the opening of the discharge passage 51d as described above, the micro-machining dust D can be discharged efficiently. Further, by supplying new liquid W into the groove 51a via the supply passage 51c, replacement of the liquid W can also be performed and the liquid can be easily provided for the next cutting.

Since collected micro-machining dust D can be appropriately discharged in this way, even in a case where cutting is performed in plural places, and a case where long time has been taken for cutting, cutting can be continued without being influenced by the micro-machining dust D.

In particular, in the present embodiment, most of the liquid W is reserved in the groove 51a of the integral cell 51. Thus, the area that touches ambient air can be eliminated as much as possible. Therefore, evaporation of the liquid W can be prevented, and even if time has been taken for cutting, the environment in liquid can be surely maintained. Consequently, the reliability of removal of the micro-machining dust D at the time of cutting can be enhanced.

Further, since the probe 3 and both the electrodes 11 and 12 are attached to the integral cell 51, the relative positional relationship between the probe 3 and both the electrodes 11 and 12 does not change during cutting. Therefore, an electric field can be formed in a more stable state during cutting, and micro-machining dust D can be more stably moved by electrophoresis.

In addition, it should be understood that the technical scope of the invention is not limited to the above embodiments, but various modifications can be made without departing from the spirit and scope of the invention.

For example, in the above respective embodiments, the micro-machining apparatus 1 (30, 40, 50) composed of the machining device 4 and the micro-machining dust removing device 5 has been described as an example. However, if the micro-machining dust removing device 5 is used in combination with the machining device 4, the object of the invention of removing the micro-machining dust D generated at the time of machining can be achieved only with the micro-machining dust removing device 5.

Further, in the above respective embodiments, the mask M made of chromium vapor-deposited on the sample 2 has been illustrated as a workpiece. However, the workpiece is not limited to the mask M. For example, a silicon substrate may be used as the workpiece. Further, even the mask M is not limited to a mask made of chromium.

Further, although the case where ultrapure water is used as the liquid W has been described as an example, various solutions may be used, not limited to the ultrapure water, and these solutions may be appropriately changed according to a workpiece.

Further, although the case where scratching work is performed has been described as an example of machining of the mask M, the invention is not limited to this case, and can be applied to arbitrary kinds of machining that micro-machining dust D is generated.

Further, although the case where the function generator 9 applies a direct current voltage when a voltage is applied to the first electrode 11 and the second electrode 12 has been illustrated in the above respective embodiments, the invention is not limited to application of a direct current voltage.

For example, an alternating current voltage or a positive voltage may be applied. That is, a direct current voltage, an alternating current voltage, or a pulse voltage can be separately used appropriately according to the kind of a workpiece or a liquid W. Since various kinds of voltages can be applied, particularly by utilizing the function generator 9, the usability improves. Further, high voltage can be applied by using an alternating current voltage or pulse voltage without causing electrolysis of the liquid W.

Figure 13:
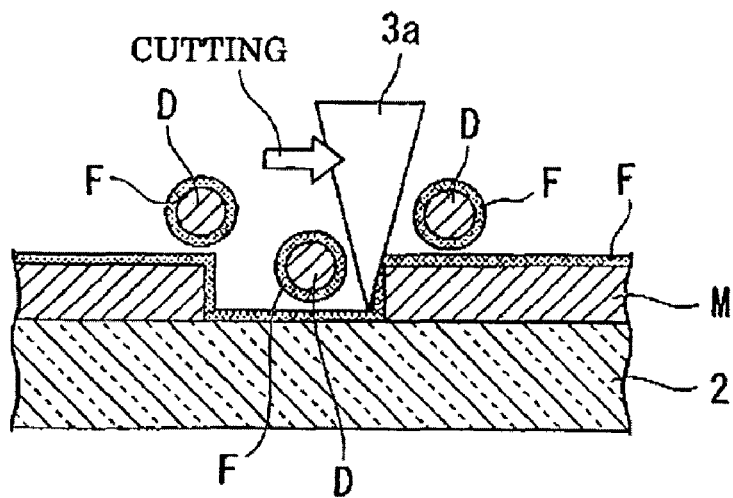
FIG. 13 is a view showing the state of a mask surface and micro-machining dust when cutting is performed by the micro-machining apparatus applied to the invention, by using a liquid containing a surfactant.
Figure 14:
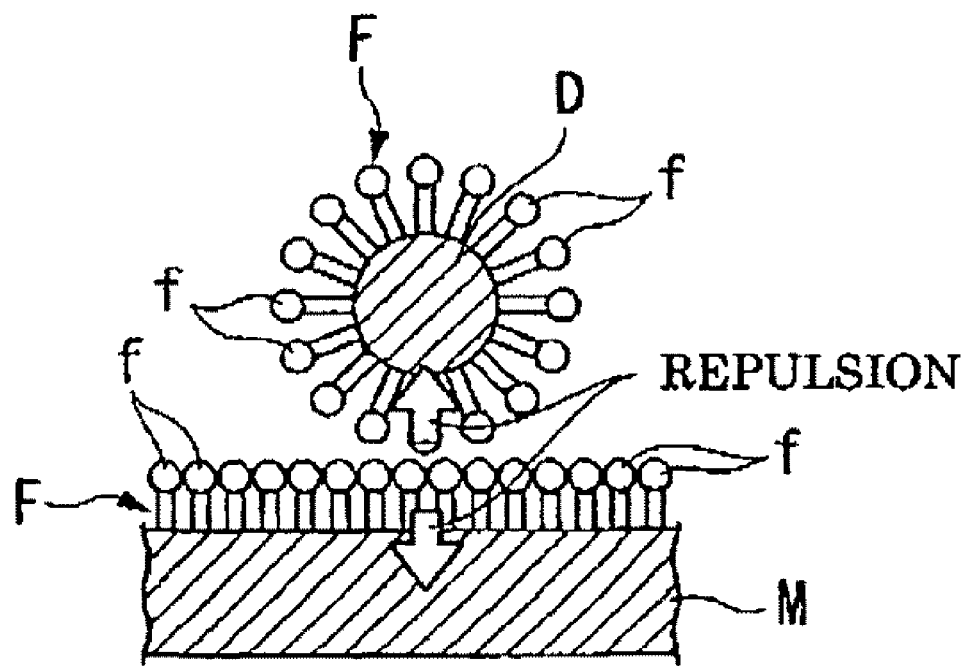
FIG. 14 is an enlarged view of the mask surface and micro-machining dust, which are shown in FIG. 13.

Further, surfactant F may be contained within a liquid W. When a liquid W containing the surfactant F contained is used, as shown in FIGS. 13 and 14, the surfactant F is coupled with the surface of the mask M or the surface of the micro-machining dust D generated at the time of cutting, with hydrophilic groups f located outside. Therefore, even if the micro-machining dust D contacts the surface of the mask M or the micro-machining dust D contacts each other, during movement thereof by electrophoresis, the dust hardly adhere to each other by mutual repulsion between the hydrophilic groups f. Accordingly, the micro-machining dust D can be moved towards the second electrode 12, while adhesion thereof to the probe tip 3a or mask M can be prevented more surely.

Further, in the above respective embodiments, the sample scanning method of moving the sample 2 in three-dimensional directions has been described as an example. However, the invention is not limited to this method, and may be applied to a probe scanning method of moving the probe 3 in three-dimensional directions. Even in this case, there is a difference only in the scanning method, and the same operational effects as the sample scanning method can be exhibited. In addition, both the sample 2 and probe 3 may be configured that they can be moved in three-dimensional directions.

Further, in the above respective embodiments, the displacement measuring means 8 has measured the deflection of the lever portion 3b by an optical lever method using laser light. However, the invention is not limited to such an optical lever method. For example, the deflection of the lever portion 3b may be may be measured by a self-detection method in which a displacement detection mechanism (for example, piezoresistive element, etc.) is provided in the lever portion 3b itself. Particularly when the integral cell 51 described in the fourth embodiment is used, it is preferable to adopt the self-detection method.

Further, in the above respective embodiments, cutting is performed in a state where the probe tip 3a is simply pressed against the surface of the mask M. However, cutting may be performed in a state where the lever portion 3b is vibrated. That is, the invention may include a vibration source (vibrating means) 60 that vibrates at least any one of the lever portion 3b and the sample stage 6 at a predetermined frequency at least in any one direction of the XY directions parallel to the surface of the mask M or the Z direction perpendicular to the surface of the mask M.

Figure 15:
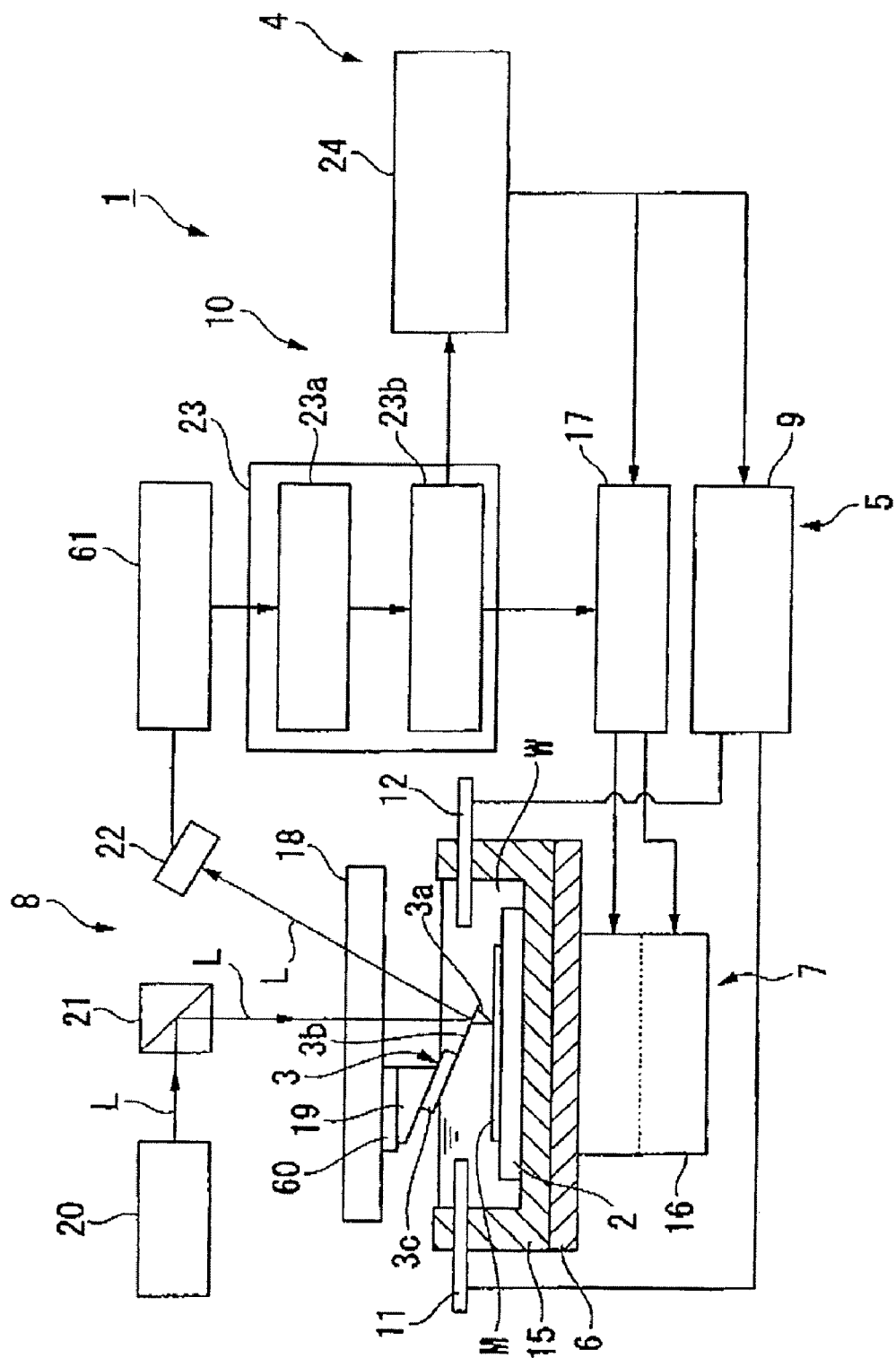
FIG. 15 is a view showing a modification of the micro-machining apparatus according to the invention, and is a configuration diagram of the micro-machining apparatus including a vibration source that vibrates a lever portion at a predetermined frequency.

Specifically, as shown in FIG. 15, the vibration source 60 for longitudinal vibrations is attached between the lower surface of the holder body 18, and the slope block 19. Thereby, the lever portion 3b vibrates at a predetermined frequency in the Z direction under vibrations transmitted from the vibration source 60 via the body part 3*c* and the slope block 19.

Further, in a case where the vibration source 60 is provided in this way, an AC-DC conversion circuit 61 that converts a DIF signal amplified by a preamplifier (not shown) into DC to output the amplified signal to the Z-voltage feedback circuit 23 is provided in front of the Z-voltage feedback circuit 23. Further, the displacement measuring means 8 measures the vibrational state of the lever portion 3*b* from the incidence position of the laser light L reflected by the reflecting surface. Also, the control unit 24 desirably feedback-controls the distance between the mask M and the probe tip 3*a* on the basis of the measurement results by the displacement measuring means 8 the so that the vibrational state (for example, amplitude) of the lever portion 3*b* may become constant.

Figure 16:
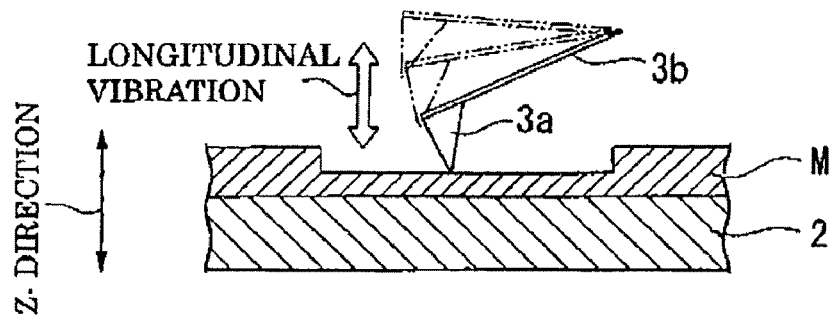
FIG. 16 is a view showing a state where cutting is performed while the lever portion is vibrated in a direction perpendicular to the surface of a mask by the vibration source shown in FIG. 15.

In the case where the vibration source 60 is provided in this way, the surface of the mask M can be cut while being continuously knocked by vibrating the lever portion 3*b* in the Z direction, as shown in FIG. 16, when a machining step. Therefore, the micro-machining dust D generated at the time of cutting becomes still finer and lightweight, and its electrification property improves. Consequently, after the micro-machining dust D is suspended still more quickly, the dust can be moved by electrophoresis, and adhesion thereof to the probe tip 3*a* or the mask M can be prevented more surely. Further, since a cutting force can be increased even with the same pressing force by vibrating the probe tip 3*a*, the workability of cutting can be improved.

In addition, although FIG. 15 shows a case where the vibration source 60 is provided between the holder body 18 and the slope block 19 as an example, the invention is limited to this case. For example, the vibration source 60 may be provided between the sample stage 6 and the XYZ stage 16, and the sample 2 and the mask M may be vibrated in the Z direction. Even in this case, the same operational effects as the above can be exhibited.

Figure 17:
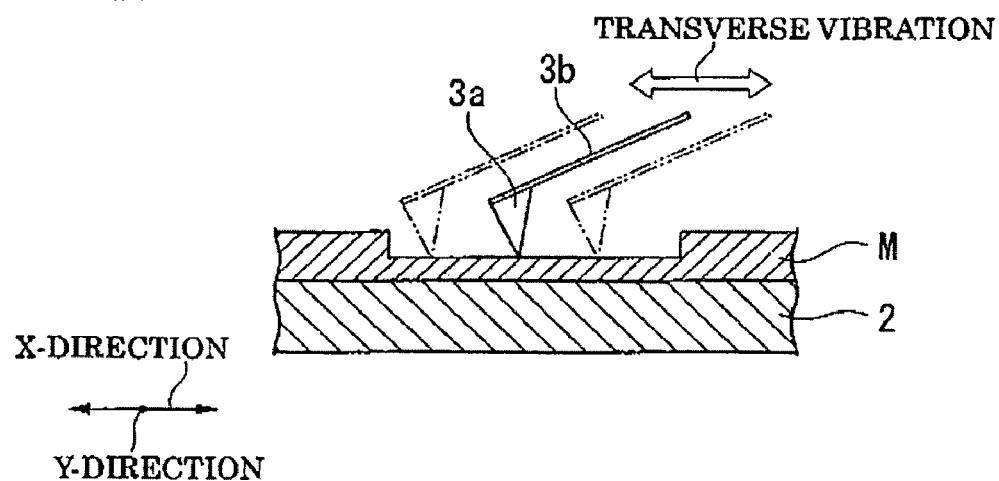
FIG. 17 is a view showing a state where cutting is performed while the lever portion is vibrated in a direction parallel to the surface of the mask by the vibration source shown in FIG. 15.

As the vibration source 60, a vibration source for transverse vibrations that vibrates the lever portion 3*b* in the XY directions may be attached, not limited to the vibration source for longitudinal vibrations that vibrates the lever portion 3*b* in the Z direction. In this case, as shown in FIG. 17, cutting can be performed while the surface of the mask M is continuously rubbed by the probe tip 3*a*. Even in this case, the same operational effects as the above can be exhibited. In addition, in the case where the lever portion is transversely vibrated in the XY directions in this way, the lever portion can be vibrated in a state where it is synchronized in the XY directions as well as the lever portion is simply vibrated in the X-direction or in the Y-direction. Since the polishing effect can be expected by adopting such a configuration, it is more preferable.

Furthermore, two vibration sources, i.e., a vibration source 60 for longitudinal vibrations and a vibration source 60 for transverse vibrations may be attached simultaneously so that cutting may be performed while both operations (transverse vibration+longitudinal vibration) are performed. Particularly by performing the transverse vibration and the longitudinal vibration simultaneously, elliptical vibration cutting can be performed, and consequently, micro-machining dust D is easily wound up. Accordingly, the micro-machining dust D can be moved still more easily.

In addition, in the case where the vibration source 60 is attached, when the surface of the mask M is observed, the surface may be observed by an AFM in after the operation of the vibration source 60 is stopped, or may be observed by a vibration mode AFM while the vibration source 60 is operated, similarly to when cutting is performed.

Figure 18:
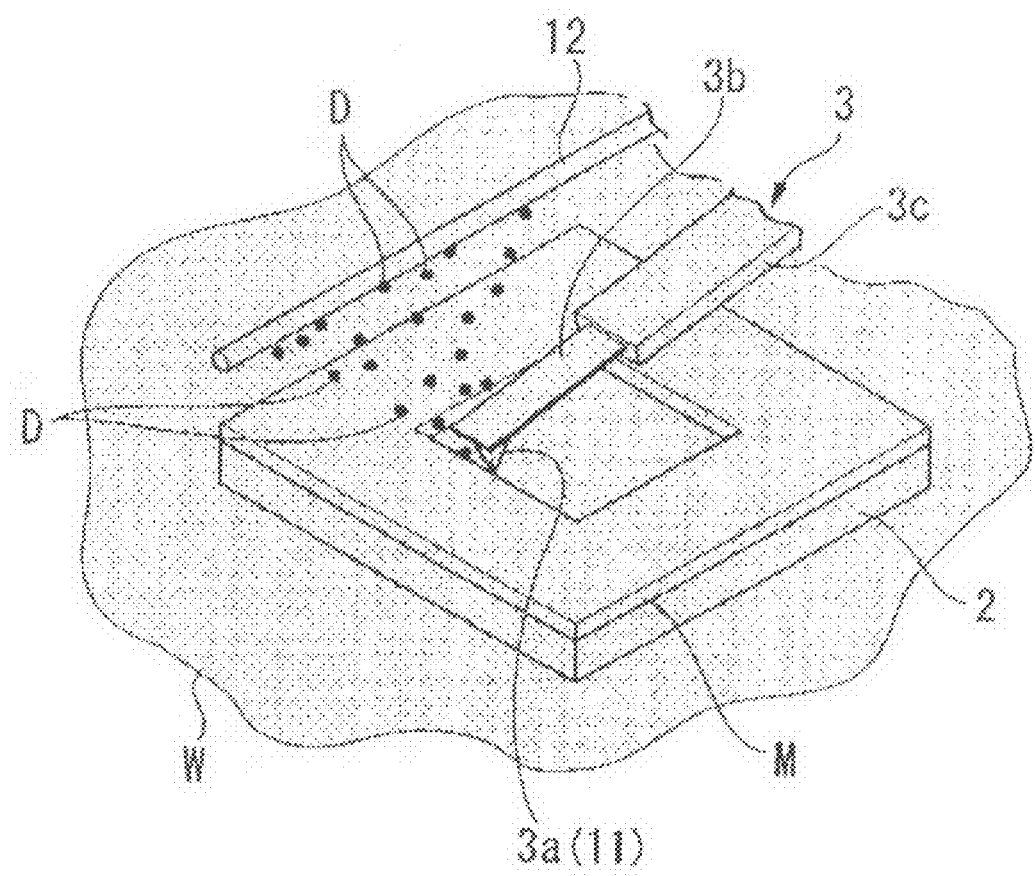
FIG. 18 is a view showing a modification of the micro-machining apparatus according to the invention, and is a configuration diagram of the micro-machining apparatus in which a probe tip is also used as the first electrode.

Further, although the case where the probe 3, the first electrode 11, and the second electrode 12 are provided have been described in the above respective embodiments, the invention is not limited to this case. For example, as shown in FIG. 18, the probe tip 3*a* may be configured so as to double as the first electrode 11.

In this case, since the probe tip 3*a* is also used as the first electrode 11, the micro-machining dust D generated by machining can be surely and instantaneously put into a strong electric field, and can be more rapidly moved by electrophoresis. Further, since it is not necessary to provide the first electrode 11 separately from the probe tip 3*a*, configuration can be simplified.

EXAMPLES

Next, an example when cutting of the mask M is actually performed on the basis of the above third embodiment will be described with reference to FIGS. 19 to 21, comparing with cutting performed by a conventional method. In addition, cutting was performed in the following conditions.

First, the mask M obtained by vapor-depositing chromium on the sample 2 was used as a workpiece. Further, the surface of the mask M was cut within a range of 20μ×20 μm. Further, the force that presses the probe tip 3*a* against the surface of the mask M, i.e., machining load, was set to 400 μN.

Figure 19A:
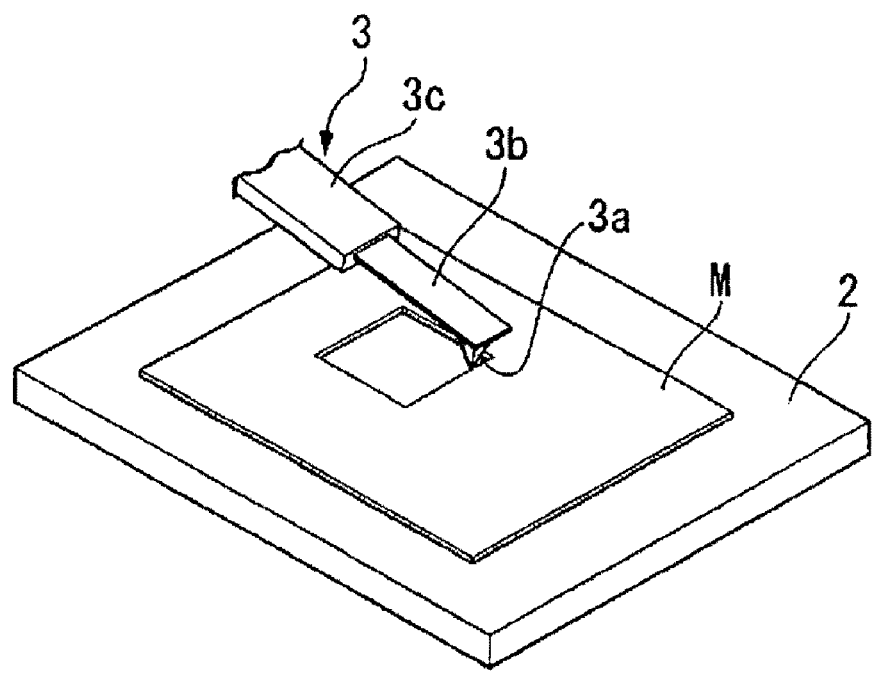
FIGS. 19A and 19B are views for explaining an example in which cutting is actually performed, and specifically.
Figure 19B:
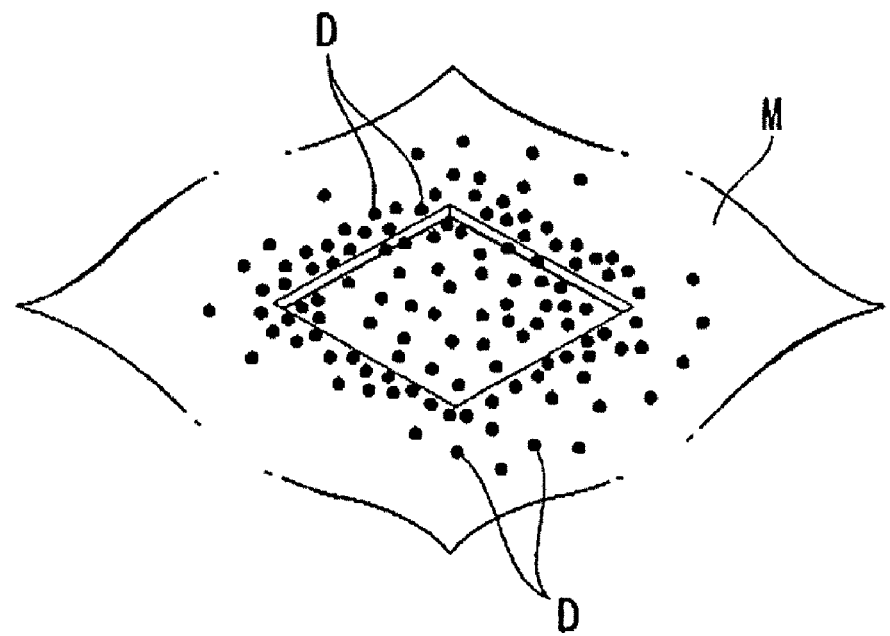

As shown FIG. 19A, initially, cutting was performed in an atmosphere according to a conventional method, on the basis of the above conditions. In this case, as shown in FIG. 19B, it was confirmed that a large amount of micro-machining dust D adhered to machining traces which the cutting was performed, and their surroundings.

Figure 20A:
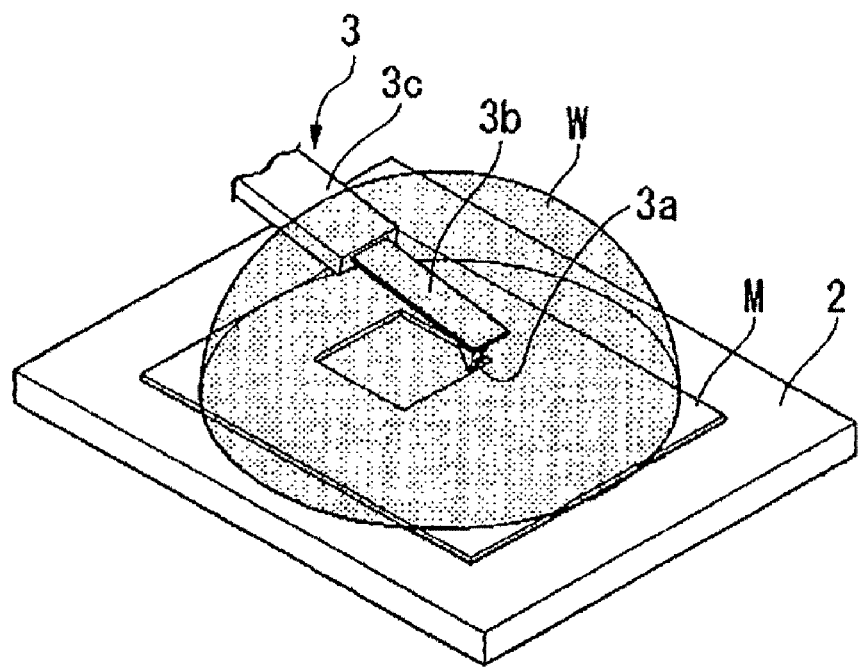
FIGS. 20A and 20B are views for explaining an example in which cutting is actually performed, and specifically.

Next, in addition to the above conditions, as shown in FIG. 20A, a region where cutting is to be performed was wrapped with droplet-like liquid W (ultrapure water containing 1% of surfactant F), and cutting was performed under such an environment-in-liquid.

Figure 20B:
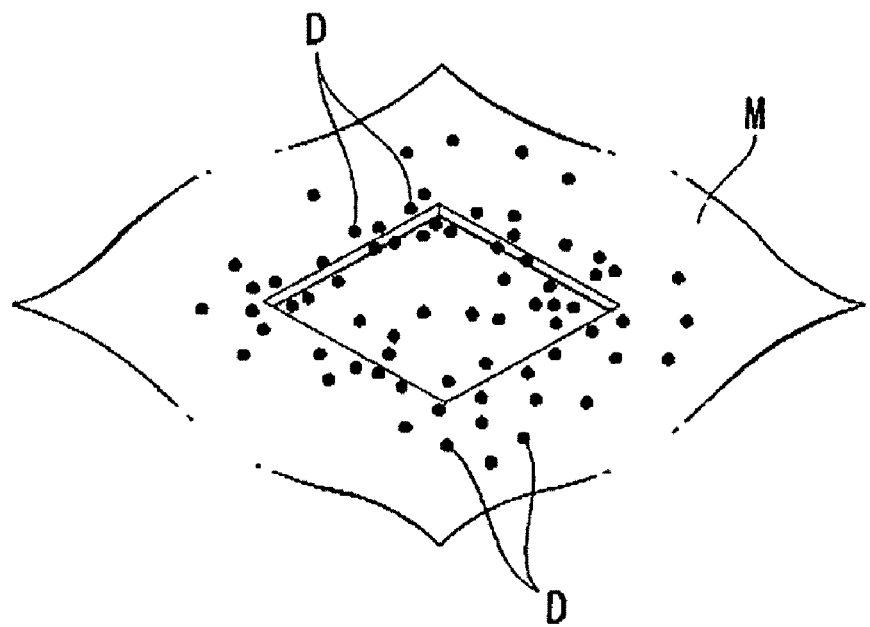

In this case, as shown in FIG. 20B, it was performed that, since the micro-machining dust D was suspended in the liquid and was influenced by the surfactant F, the number of the micro-machining dust D adhered to cutting traces and their surroundings decreased as compared with that in the above-described environment in the atmosphere, but a number of micro-machining dust D still remained.

Figure 21A:
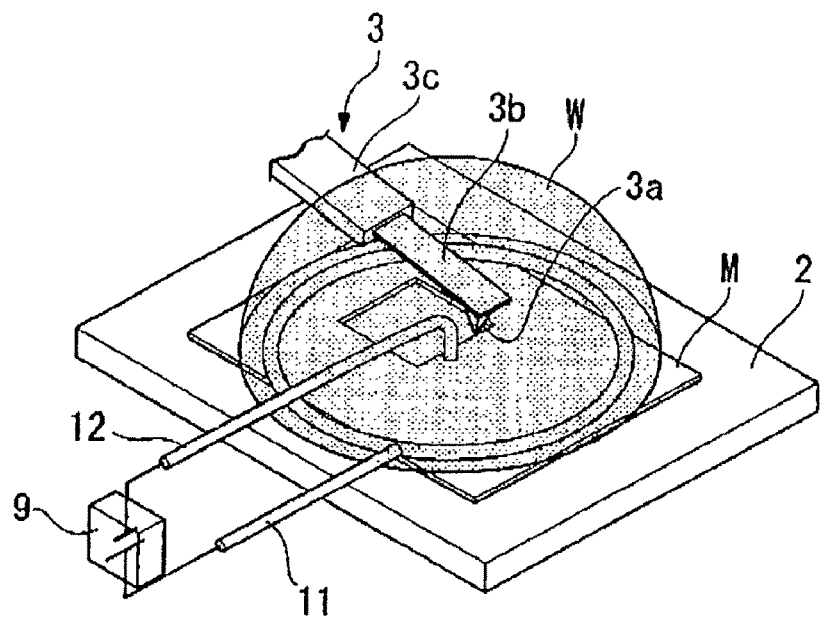
FIGS. 21A and 21B are views for explaining an example in which cutting is actually performed, and specifically.

On the other hand, as shown in FIG. 21A, in addition to the above conditions in liquid, cutting was performed on the basis of the above-described third embodiment. That is, the cutting was performed while a voltage was applied between the first electrode 11 that is formed annularly and the second electrode 12 that is arranged substantially around this first electrode 11. In addition, Au electrodes were used as both the electrodes 11 and 12. Further, the voltage of the direct current 2.5 V was applied to both the electrodes 11 and 12.

Figure 21B:
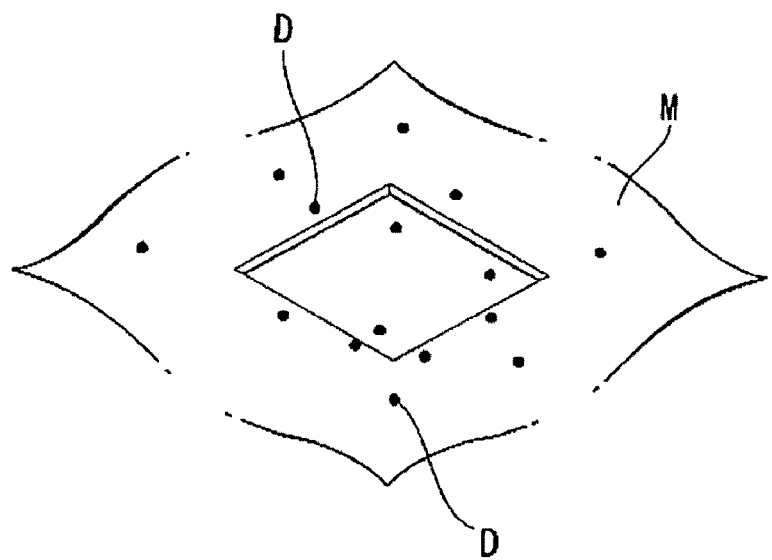

In this case, as shown in FIG. 21B, it was confirmed that the micro-machining dust D was hardly checked on cutting traces and their surroundings, but the micro-machining dust D could be removed. From these results, the effects of the micro-machining dust removing device, the micro-machining apparatus, and the micro-machining dust removing method according to the invention could be confirmed, and the advantageous effects, which were not conventionally, that cutting, such as mask correction, could be was performed while the micro-machining dust D was removed could be confirmed.

Figure 22:
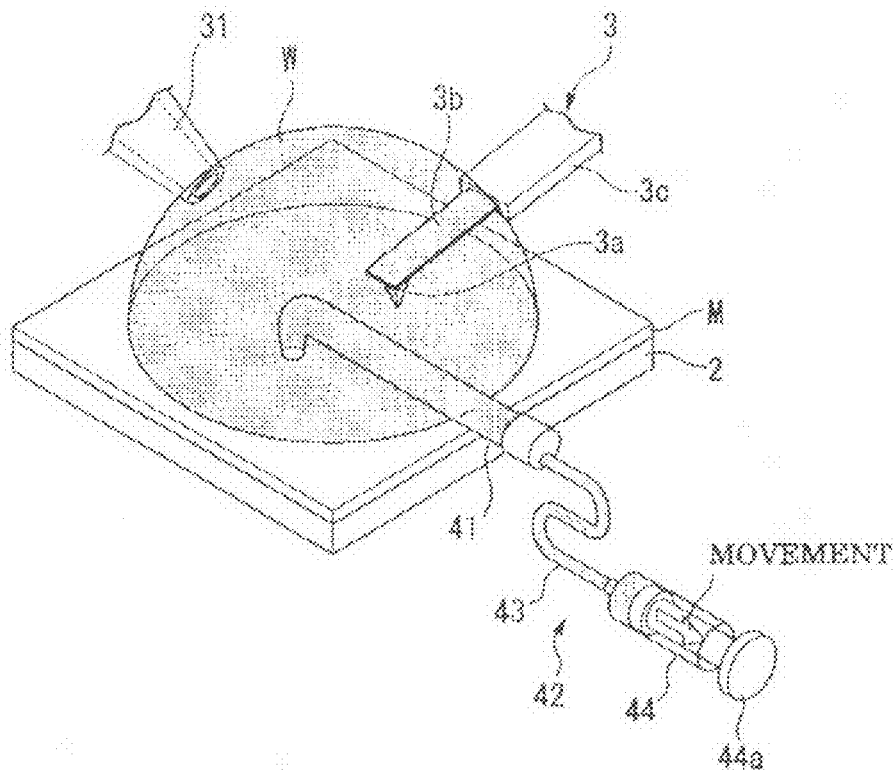
FIG. 22 is a modification of the third embodiment according to the invention, and is a perspective view showing a state where cutting is performed in a state where a liquid suction device is added instead of both the electrodes.

Further, as shown in FIG. 22, even in a case where both the electrodes 11 and 12 are not used like the above-described third embodiment, the liquid suction device 42 is provided, so that cutting can be performed while the influence of the micro-machining dust D is suppressed as much as possible. That is, by sucking the droplet-like liquid W using the liquid suction device 42 after cutting, the micro-machining dust D suspended in the liquid W can be discharged together with the liquid W.

Particularly by rapidly operating the liquid suction device 42 after cutting, the micro-machining dust D can be discharged in a state where it is suspended in a liquid. Further, by appropriately sucking the liquid W in a state where cutting is stopped temporarily even during the cutting, the generated micro-machining dust D can be discharged efficiently.

Figure 23:
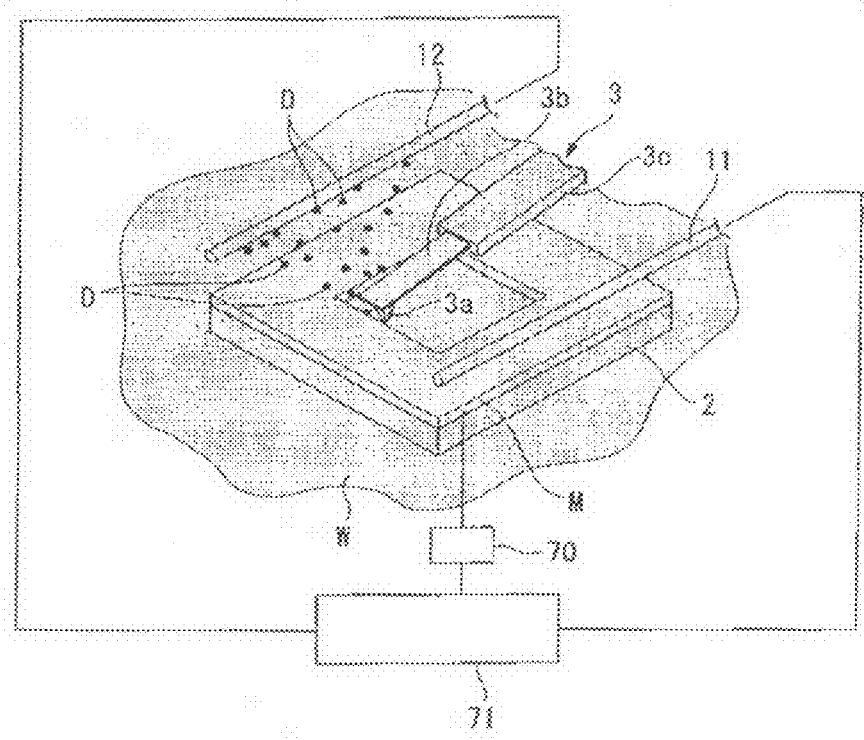
FIG. 23 a view showing a modification of the micro-machining apparatus according to the invention, and is a configuration diagram of the micro-machining apparatus including which a probe tip is also used as the first electrode.

In addition, in the above micro-machining dust removing method and device, in order for the surface of a work material not to cause electrochemical corrosion when an electric field is applied using two insertion electrodes in a liquid, as shown in FIG. 23, a reference electrode is potentiostatically connected to the work material, the potential on the surface of the work material is set to a reference potential, and the two insertion electrodes for electrophoresis are used as a working electrode and a counter electrode, respectively. Thereby, in the course of applying an electric field for electrophoresis to between the working electrode and the counter electrode, a current does not flow into the surface of the work material during the electrophoresis. Consequently, the type of work materials that can be used can be increased such that the micro-machining dust removal method according to this technique can be applied even to the surface of a work material, such as metal and a semiconductor, where electrochemical reaction is apt to occur, and the usability can be improved.

What is claimed is:

1. A micro-machining dust removing method of removing the micro-machining dust generated at the time of machining by electrophoresis while a workpiece is machined within a liquid using a probe tip, the method comprising the steps of:
   dipping at least the probe tip and a first and second electrodes in liquid with a probe having the probe tip provided on or above the workpiece, and the probe tip sandwiched between the first electrode and the second electrodes;
   specifying a position where the machining is to be performed by observing the workpiece by AFM observation utilizing the probe and locating the probe tip on the specified position of the workpiece;
   applying a predetermined voltage to between the first electrode and the second electrode; and
   machining the workpiece using the probe tip by moving the probe tip relative to the workpiece.

2. The micro-machining dust removing method according to claim 1,
   wherein a voltage is applied using the first electrode arranged in a circular-arc shape or in an annular shape around the second electrode.

3. The micro-machining dust removing method according to claim 1,
   wherein the workpiece is accommodated within a liquid cell having the liquid reserved therein, and at least the probe tip, the first electrode, and the second electrode are arranged so as to be dipped in the liquid.

4. The micro-machining dust removing method according to claim 3, further comprising a liquid discharge/supply step of discharging the liquid to the outside from the inside of the liquid cell and supplying a new liquid into the liquid cell, after machining the workpiece.

5. The micro-machining dust removing method according to claim 1,
   wherein the liquid is discharged onto the workpiece such that at least the probe tip, the first electrode, and the second electrode are dipped.

6. The micro-machining dust removing method according to claim 5, further comprising a liquid sucking step of sucking a liquid via a hollow micro nozzle arranged such that its tip is dipped in the liquid, from its base end after machining the workpiece.

7. The micro-machining dust removing method according to claim 6,
   wherein the second electrode is housed at least in the tip of the micro nozzle that is dipped in the liquid.

8. The micro-machining dust removing method according to claim 1,
   wherein an integral cell to which at least the probe, the first electrode, and the second electrode are attached is arranged in a position close to the workpiece, and then the liquid is reserved between the integral cell and the workpiece such that the probe, the first electrode, and the second electrode are dipped, thereby making the environment in liquid.

9. The micro-machining dust removing method according to claim 8, further comprising a liquid discharge/supply step of discharging the liquid to the outside from the inside of the integral cell via a discharge passage formed in the integral cell, and supplying a new liquid into the integral cell via a supply passage formed in the integral cell, after machining the workpiece.

10. The micro-machining dust removing method according to claim 9,
    wherein the second electrode is housed within the discharge passage.

11. The micro-machining dust removing method according to claim 1, wherein the probe tip is supported in a cantilevered state by the lever portion, and
    when the machining step is performed, machining is performed while controlling the distance between the probe tip and the workpiece such that the deflection of the lever portion becomes constant.

12. The micro-machining dust removing method according to claim 11,
    wherein at least any one of the lever portion and the workpiece is vibrated at least in any one direction of a direction parallel to the surface of the workpiece and a direction perpendicular thereto, and the machining is performed while the controlling is performed such that a vibrational state becomes constant.

13. The micro-machining dust removing method according to claim 1,
    wherein any one of a direct current voltage, an alternating current voltage, and a pulse voltage is applied during the voltage application step.

14. The micro-machining dust removing method according to claim 1,
    wherein a liquid containing a surfactant is used as the liquid.

15. The micro-machining dust removing method according to claim 1,
    wherein an electric field for electrophoresis is applied by potentiostatically connecting a reference electrode to a work material, setting the potential on the surface of the work material to a reference potential, and using two insertion electrodes for electrophoresis as a working electrode and a counter electrode, respectively so that a current may not flow into the surface of the work material during electrophoresis, thereby preventing an electrochemical reaction on the surface of the work material.

16. A micro-machining apparatus for removing the micro-machining dust generated at the time of machining while a workpiece is machined within a liquid using a probe tip, the apparatus comprising:
a machining device having a stage on which the workpiece is to be placed, a probe having the probe tip and arranged such that the probe tip faces the workpiece, and a moving means for moving the stage and the probe relative to each other to machine the workpiece by the probe tip; and
a micro-machining dust removing device having a first electrode and a second electrode that are arranged in the liquid so as to sandwich the probe tip therebetween, and a voltage application means for applying a voltage to between the first electrode and the second electrode to move the micro-machining dust in the liquid.

17. The micro-machining apparatus according to claim 16, wherein the first electrode is arranged in a circular-arc shape or in an annular shape around the second electrode.

18. The micro-machining apparatus according to claim 16, further comprising a liquid cell having the liquid reserved therein, and having at least the exploring needle, the first electrode, and the second electrode accommodated therein so as to be dipped in the reserved liquid.

19. The micro-machining apparatus according to claim 18, further comprising a liquid discharge/supply means that discharges the reserved liquid to the outside from the inside of the liquid cell and supplies a new liquid into the liquid cell.

20. The micro-machining apparatus according to claim 16, further comprising a liquid sucking means for sucking a liquid via a hollow micro nozzle from its base end, the micro nozzle being arranged such that its tip is dipped in the liquid.

21. The micro-machining apparatus according to claim 20, wherein the second electrode is housed at least in the tip of the micro nozzle that is dipped in the liquid.

22. The micro-machining apparatus according to claim 16, further comprising an integral cell that is arranged in a position close to the workpiece to reserve the liquid between itself and the workpiece to make an environment in liquid,
wherein at least the probe, the first electrode, and the second electrode are attached to the integral cell so as to be dipped in the reserved liquid.

23. The micro-machining apparatus according to claim 22, further comprising a liquid discharge/supply means that has a supply passage and a discharge passage formed in the integral cell, and that discharges the reserved liquid to the outside from the integral cell via the discharge passage, and supplies a new liquid into the integral cell via the supply passage.

24. The micro-machining apparatus according to claim 23, wherein the second electrode is housed within the discharge passage.

25. The micro-machining apparatus according to claim 16, wherein the exploring needle has a base end supported in a cantilevered state by the lever part, and the apparatus further comprises a displacement measuring means for measuring the deflection of the lever part, and a control means for controlling a moving means on the basis of measurement results by the displacement measuring means to adjust the distance between the exploring needle and the workpiece such that the deflection of the lever part becomes constant.

26. The micro-machining apparatus according to claim 25, further comprising a vibrating means that vibrates at least any one of the lever part and the workpiece at least in any one direction of XY directions parallel to the surface of the workpiece and a Z direction perpendicular thereto,
wherein the displacement measuring means measures the vibrational state of the lever part, and
wherein the control means controls the moving means on the basis of measurement results by the displacement measuring means to adjust the distance between the exploring needle and the workpiece such that the vibrational state of the lever part becomes constant.

27. The micro-machining apparatus according to claim 16, wherein the voltage application means applies any one of a direct current voltage, an alternating current voltage, and a pulse voltage.

28. The micro-machining apparatus according to claim 16 wherein the exploring needle is formed from any one of diamond, Si and SiN.

29. The micro-machining apparatus according to claim 16, wherein the exploring needle also serves as the first electrode.

30. A micro-machining dust removing device used in combination with a machining device that machines a workpiece using an exploring needle to remove, within a liquid, the micro-machining dust generated at the time of the machining, the device comprising:
a first electrode and a second electrode that are arranged in the liquid so as to sandwich the exploring needle therebetween, wherein the first electrode is arranged in a circular-arc shape or in an annular shape around the second electrode; and
a voltage application means for applying a voltage apply to between the first electrode and the second electrode to move the micro-machining dust in the liquid.

31. The micro-machining dust removing device according to claim 30, further comprising a liquid sucking means for sucking a liquid via a hollow micro nozzle from its base end the micro nozzle being arranged such that its tip is dipped in the liquid.

32. The micro-machining dust removing device according to claim 31,
wherein the second electrode is housed at least in the tip of the micro nozzle that is dipped in the liquid.

33. The micro-machining dust removing device according to claim 30,
wherein the voltage application means is further for applying any one of a direct current voltage, an alternating current voltage, and a pulse voltage.

34. The micro-machining dust removing device according to claim 16,
wherein an electric field for electrophoresis is applied by potentiostatically connecting a reference electrode to a work material, setting the potential on the surface of the work material to a reference potential, and using two insertion electrodes for electrophoresis as a working electrode and a counter electrode, respectively so that a current may not flow into the surface of the work material during electrophoresis, thereby preventing an electrochemical reaction on the surface of the work material.

* * * * *

UNITED STATES PATENT AND TRADEMARK OFFICE
CERTIFICATE OF CORRECTION

PATENT NO. : 8,062,494 B2
APPLICATION NO. : 11/810230
DATED : November 22, 2011
INVENTOR(S) : Futoshi Iwata et al.

It is certified that error appears in the above-identified patent and that said Letters Patent is hereby corrected as shown below:

In the Claims

In column 30, claim 28, line 18, immediately after "to claim 16" insert --,--.

In column 30, claim 30, line 34, after "for applying a voltage" delete "apply".

In column 30, claim 31, line 39, immediately after "its base end" insert --,--.

Signed and Sealed this
Twelfth Day of June, 2012

David J. Kappos
*Director of the United States Patent and Trademark Office*